(12) United States Patent
Li et al.

(10) Patent No.: US 11,728,830 B2
(45) Date of Patent: Aug. 15, 2023

(54) METHODS AND APPARATUS FOR PROCESSING LDPC CODED DATA

(71) Applicant: ZTE CORPORATION, Guangdong (CN)

(72) Inventors: Liguang Li, Guangdong (CN); Jun Xu, Guangdong (CN); Jin Xu, Guangdong (CN)

(73) Assignee: ZTE CORPORATION, Guangdong (CN)

( * ) Notice: Subject to any disclaimer, the term of this patent is extended or adjusted under 35 U.S.C. 154(b) by 0 days.

(21) Appl. No.: 17/566,846

(22) Filed: Dec. 31, 2021

(65) Prior Publication Data

US 2022/0158658 A1 May 19, 2022

Related U.S. Application Data

(63) Continuation of application No. 16/790,046, filed on Feb. 13, 2020, now Pat. No. 11,233,531, which is a
(Continued)

(51) Int. Cl.
*H03M 13/00* (2006.01)
*H03M 13/25* (2006.01)
(Continued)

(52) U.S. Cl.
CPC ....... *H03M 13/255* (2013.01); *H03M 13/118* (2013.01); *H03M 13/2707* (2013.01); *H03M 13/6508* (2013.01)

(58) Field of Classification Search
CPC ............. H03M 13/255; H03M 13/118; H03M 13/2707; H03M 13/6508; H03M 13/6368;
(Continued)

(56) References Cited

U.S. PATENT DOCUMENTS

| 6,029,264 A | * | 2/2000 | Kobayashi | ............ | H03M 13/29 |
| | | | | | 714/755 |
| 6,798,846 B2 | * | 9/2004 | Von Elbwart | ......... | H04L 1/1819 |
| | | | | | 375/298 |

(Continued)

FOREIGN PATENT DOCUMENTS

| CN | 101005334 A | 7/2007 |
| CN | 101188428 A | 5/2008 |

(Continued)

OTHER PUBLICATIONS

InterDigital Inc., LDPC Rate Matching Design, 3GPP TSG RAN WG1 #90, R1-1714168, Prague, Czech Republic, Aug. 2017, 9 pages.

(Continued)

*Primary Examiner* — Esaw T Abraham
(74) *Attorney, Agent, or Firm* — Duane Morris LLP

(57) ABSTRACT

Methods and Apparatus for processing data encoded by low density parity check (LDPC) in a communication system are disclosed herein. In one embodiment, a method performed by a first node is disclosed. The method comprises: encoding an information bit sequence based on an LDPC coding scheme to obtain an encoded bit sequence; generating a master bit sequence based on the encoded bit sequence; selecting a subset of the master bit sequence according to a rate matching rule to obtain a rate matched bit sequence; interleaving the rate matched bit sequence according to a predetermined index sequence to obtain a to-be-transmitted bit sequence; and transmitting the to-be-transmitted bit sequence to a second node.

20 Claims, 14 Drawing Sheets

Related U.S. Application Data continuation of application No. PCT/CN2017/101278, filed on Sep. 11, 2017.

(51) Int. Cl.
 *H03M 13/11* (2006.01)
 *H03M 13/27* (2006.01)

(58) Field of Classification Search
 CPC ......... H03M 13/1174; H03M 13/2778; H03M 13/6393; H03M 13/1177
 See application file for complete search history.

(56) References Cited

U.S. PATENT DOCUMENTS

| | | | |
|---|---|---|---|
| 6,961,888 B2 | 11/2005 | Jin | |
| 7,110,470 B2 * | 9/2006 | Von Elbwart | H04L 27/38 375/298 |
| 7,346,832 B2 * | 3/2008 | Richardson | H03M 13/118 714/779 |
| 7,865,813 B2 * | 1/2011 | Spencer | H03M 13/6356 714/790 |
| 8,781,006 B2 * | 7/2014 | Avudainayagam | H04L 5/0016 375/260 |
| 10,523,386 B2 * | 12/2019 | Kim | H04L 1/0066 |
| 10,735,134 B2 | 8/2020 | Soriaga | |
| 2004/0153934 A1 | 8/2004 | Jin | |
| 2009/0304111 A1 | 12/2009 | Shinya | |
| 2012/0320880 A1 | 12/2012 | Han | |
| 2019/0013901 A1 | 1/2019 | Nimbalker | |
| 2019/0052290 A1 | 2/2019 | Andersson | |
| 2019/0229751 A1 | 7/2019 | Kim | |
| 2019/0356341 A1 | 11/2019 | Ma | |
| 2020/0145026 A1 | 5/2020 | Li | |
| 2020/0162196 A1 | 5/2020 | Jeong | |

FOREIGN PATENT DOCUMENTS

| | | |
|---|---|---|
| CN | 101277118 A | 10/2008 |
| CN | 101489135 A | 7/2009 |
| CN | 101867443 A | 10/2010 |
| CN | 103597748 A | 2/2014 |
| CN | 107026709 A | 8/2017 |
| CN | 109120374 A | 1/2019 |
| CN | 109391360 A | 2/2019 |
| JP | 2020-511030 A | 4/2020 |
| WO | 2018144560 A1 | 8/2018 |
| WO | 2018169339 A1 | 9/2018 |
| WO | 2018171043 A1 | 9/2018 |
| WO | 2019029309 A1 | 2/2019 |

OTHER PUBLICATIONS

Fang "Crossover probability Estimation using mean-intrinsic-LLR of LDPC syndrome" IEEE Communications Letters, 13(9), Oct. 9, 2009, 679-681.

Gao Xiang, et al. "Coded cooperation relay scheme based on low density lattice code" Systems Engineering and Electronics, 39(5), Dec. 19, 2016, 1126-1133.

Samsung, "Rate Matching for Data Channel Coding", 3GPP TSG RAN WG1 #90, R1-1714590, Prague, Czechia, Aug. 21-25, 2017, 4 pages.

Nokia, Nokia Shanghai Bell, "Rate Matching for LDPC", 3GPP TSG RAN WG1 #90, R1, 1714375, Prague, Czech Republic, Aug. 21-25, 2017, 4 pages.

Qualcomm Incorporated, "LDPC Rate Matching", 3GPP TSG RAN WG1 #90, R1-1713462, Prague, Czech Republic, Aug. 21-25, 2017, 7 pages.

LG Eletronics, "Redundancy version addressing for circular buffer", 3GPP TSG RAN WG1 Meeting #90, R1-1713210, Prague, Czech Republic, Aug. 21-25, 2017, 4 pages.

Mediatek Inc., "eMBB Encoding Chain", 3GPP TSG RAN WG1 NR, R1-1702732, Athens, Greece, Feb. 13-17, 2017, 9 pages.

Nokia, LS on Channel Coding , 3GPP TSG RAN WG1 #90, R1-1715317, Prague, Czech Republic, Aug. 2017, 18 pages.

ZTE, On rate matching for LDPC code, 3GPP TSG RAN WG1 #90, R1-1713231, Prague, Czech Republic, Aug. 2017, 6 pages.

Ericsson, Rate Matching for NR LDPC codes, 3GPP TSG RAN WG1 NR Ad-Hoc#2, R1-1710485, Qingdao, P.R. China Jun. 27-30, 2017, 7 pages.

CATT, "Offset optimization for NR LDPC", 3GPP TSG RAN WG1 NR Ad-Hoc#2, R1-1710047, Qingdao, P.R. China Jun. 27-30, 2017, 8 pages.

Huawei, "Rate matching for LDPC codes", 3GPP TSG RAN WG1 NR Ad-Hoc#2, R1-1711438, Qingdao, P.R. China Jun. 27-30, 2017, 6 pages.

Nokia, "Rate matching for LDPC", 3GPP TSG RAN WG1 NR Ad-Hoc#2, R1-1711536, Qingdao, P.R. China Jun. 27-30, 2017, 5 pages.

\* cited by examiner

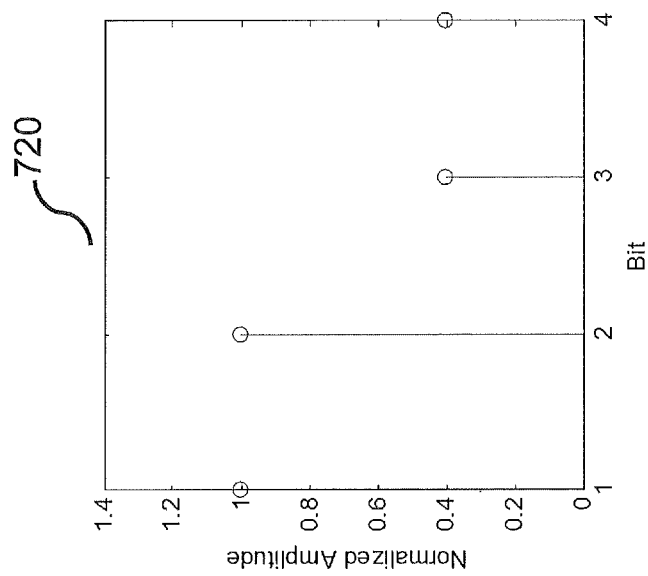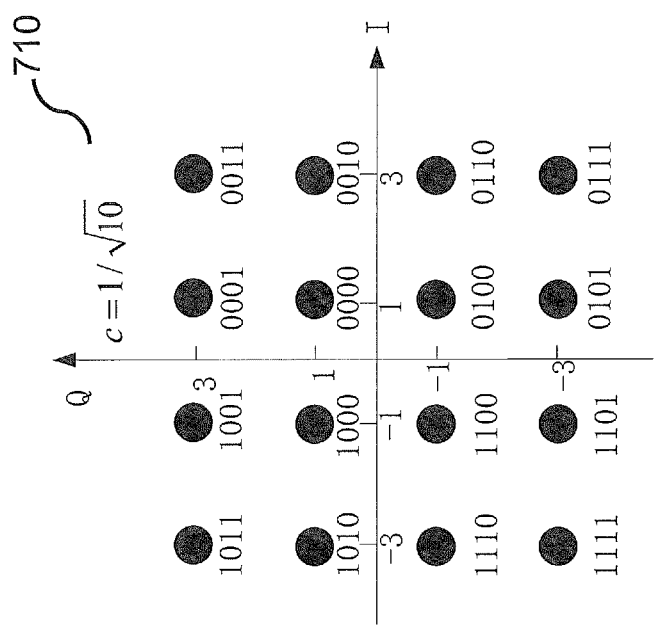
FIG. 7

METHODS AND APPARATUS FOR PROCESSING LDPC CODED DATA

RELATED APPLICATIONS

This application is a continuation of U.S. patent application Ser. No. 16/790,046, filed Feb. 13, 2020, now U.S. Pat. No. 10,233,531 issued on Jan. 25, 2022, which is a continuation of International Application No. PCT/US2017/101378, filed on Sep. 11, 2017.

TECHNICAL FIELD

The disclosure relates generally to communication systems and, more particularly, to methods and apparatus for processing data encoded by low density parity check (LDPC) in a communication system.

BACKGROUND

A digital communication system typically includes three parts: a transmitting end, a channel, and a receiving end. The transmitting end may encode an information sequence to obtain encoded codewords, interleave the encoded codewords, and map the interleaved bits into modulation symbols, and then may process and transmit the modulation symbols according to communication channel information. In the channel, multipath, movement and other factors can lead to a specific channel response, which will make the data transmission distorted. In addition, noise and interference will further deteriorate the data transmission. The receiving end receives the modulated symbol data that pass through the channel. At the receiving end, data are distorted and specific processing is needed to restore the original information sequence.

Based on some information sequence encoding method applied at the transmitting end, the receiving end can process the received data accordingly to reliably restore the original information sequence. Typically, the encoding method is based on forward error correction (FEC) that adds some redundant information to the information sequence. The receiving end can utilize the redundant information to reliably restore the original information sequence.

Some common FEC codes include: convolutional code, Turbo code, and Low Density Parity Check (LDPC) code. In the FEC encoding process, a k-bit information sequence is encoded with FEC to obtain an n-bit FEC coded codeword (redundant bit is n-k), where the FEC coding rate is k/n. LDPC code is a linear block code that can be defined by a very sparse parity check matrix or binary map. Due to the sparsity of its parity check matrix, LDPC achieves a low complexity of codec and becomes practical. Proved by a variety of practice and theory, LDPC codes are the most well-behaved channel codes in an Additive White Gaussian Noise (AWGN) channel, and its performance is very close to the Shannon limit. In a parity check matrix of the LDPC code, each row is a parity check code. If a bit value of an index position element is equal to 1 in a row, it indicates that the bit is participating in the parity check code. If it is equal to 0, then the bit at this position does not participate in the parity check code.

Due to its structural characteristic, quasi-cyclic LDPC code becomes popular in many applications, such as IEEE802.11ac, IEEE802.11ad, IEEE802.11aj, IEEE802.16e, IEEE802.11n, microwave communications, optical fiber communications, and so on. The 5G NR (new radio) mobile communication has adopted the quasi-cyclic LDPC code as a channel coding scheme.

In an LDPC communication system, after the LDPC coding is performed to obtain the LDPC codewords, since the transmission resources allocated by the system may not be enough to completely transmit the entire LDPC codeword, it is necessary to carry out rate matching of the LDPC codewords. During the rate matching process, a codeword is resized before being sent over the channel, in order to match a transmission rate consistent with the allocated transmission resources. For example, in a 5G system, rate matching may mean that a portion of bits in a cache storing the LDPC codewords are read out for transmission, according to a redundancy version. During rate matching, a bit selection is made from a starting bit in the cache storing the LDPC codewords, where an index of the starting bit is typically indicated by the redundancy version.

Due to the structured coding characteristics of quasi-cyclic LDPC coding and other factors, selection of starting bit and/or definition of redundancy version will have a significant impact on the system performance after the rate matching. In particular, existing methods for starting bit selection in rate matching can cause the data retransmission performance to be unstable. That is, some retransmitted data have a good performance; but other retransmitted data have a poor performance. In addition, in a scenario of high order modulation and fading channels, existing methods for processing LDPC coded data may damage system performance.

As such, there is no effective solution for the above mentioned problems in existing literatures or existing technologies.

SUMMARY

The exemplary embodiments disclosed herein are directed to solving the issues relating to one or more of the problems presented in the prior art, as well as providing additional features that will become readily apparent by reference to the following detailed description when taken in conjunction with the accompany drawings. In accordance with various embodiments, exemplary systems, methods, devices and computer program products are disclosed herein. It is understood, however, that these embodiments are presented by way of example and not limitation, and it will be apparent to those of ordinary skill in the art who read the present disclosure that various modifications to the disclosed embodiments can be made while remaining within the scope of the present disclosure.

In one embodiment, a method performed by a first node is disclosed. The method comprises: encoding an information bit sequence based on a low density parity check (LDPC) coding scheme to obtain an encoded bit sequence; generating a master bit sequence based on the encoded bit sequence; selecting a subset of the master bit sequence according to a rate matching rule to obtain a rate matched bit sequence; interleaving the rate matched bit sequence according to a predetermined index sequence to obtain a to-be-transmitted bit sequence; and transmitting the to-be-transmitted bit sequence to a second node.

In a different embodiment, a communication node configured to carry out a disclosed method in some embodiment is disclosed.

In yet another embodiment, a non-transitory computer-readable medium having stored thereon computer-executable instructions for carrying out a disclosed method in some embodiment is disclosed.

BRIEF DESCRIPTION OF THE DRAWINGS

Various exemplary embodiments of the present disclosure are described in detail below with reference to the following Figures. The drawings are provided for purposes of illustration only and merely depict exemplary embodiments of the present disclosure to facilitate the reader's understanding of the present disclosure. Therefore, the drawings should not be considered limiting of the breadth, scope, or applicability of the present disclosure. It should be noted that for clarity and ease of illustration these drawings are not necessarily drawn to scale.

FIG. 7 illustrates a constellation of 16 QAM (Quadrature Amplitude Modulation) and its corresponding demodulated log likelihood ratios (LLRs), in accordance with some embodiments of the present disclosure.

DETAILED DESCRIPTION OF EXEMPLARY EMBODIMENTS

Figure 1:
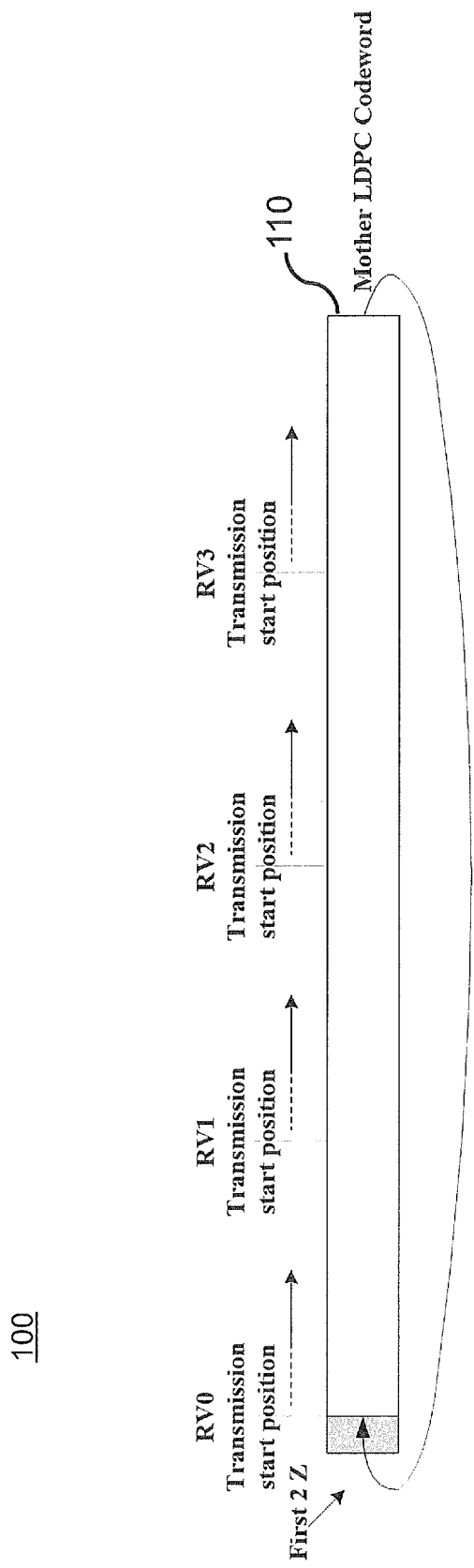
FIG. 1 illustrates an exemplary rate matching scheme for LDPC code with a circular buffer, in accordance with some embodiments of the present disclosure.

Various exemplary embodiments of the present disclosure are described below with reference to the accompanying figures to enable a person of ordinary skill in the art to make and use the present disclosure. As would be apparent to those of ordinary skill in the art, after reading the present disclosure, various changes or modifications to the examples described herein can be made without departing from the scope of the present disclosure. Thus, the present disclosure is not limited to the exemplary embodiments and applications described and illustrated herein. Additionally, the specific order or hierarchy of steps in the methods disclosed herein are merely exemplary approaches. Based upon design preferences, the specific order or hierarchy of steps of the disclosed methods or processes can be re-arranged while remaining within the scope of the present disclosure. Thus, those of ordinary skill in the art will understand that the methods and techniques disclosed herein present various steps or acts in a sample order, and the present disclosure is not limited to the specific order or hierarchy presented unless expressly stated otherwise.

To improve system performance after the rate matching and achieve retransmission performance stability, the present teaching discloses methods and apparatus for selecting starting bit location corresponding to each redundancy version (RV) and discloses a bit interleaving method to solve the problem of poor performance of quasi-cyclic LDPC coding under high order modulation or fading channels.

A parity check matrix H of the quasi-cyclic LDPC code is a matrix of M×Z rows and N×Z columns, which is composed of M×N sub-matrices. Each sub-matrix is a different power of the basic permutation matrix of size Z×Z. That is, each sub-matrix is obtained by cyclically shifting the unit matrix of size Z×Z by a number of values. In order to mathematically describe the cyclic shift of the unit matrix more easily, the parity check matrix of the quasi-cyclic LDPC code can be described with the following mathematical formula:

$$H = \begin{bmatrix} P^{hb_{11}} & P^{hb_{12}} & P^{hb_{13}} & \cdots & P^{hb_{1N}} \\ P^{hb_{21}} & P_{hb_{22}} & P^{hb_{23}} & \cdots & P^{hb_{2N}} \\ \cdots & \cdots & \cdots & & \cdots \\ P^{hb_{M1}} & P^{hb_{M2}} & P^{hb_{M3}} & \cdots & P^{hb_{MN}} \end{bmatrix} = P^{Hb}.$$

If $hb_{ij}=-1$, then $P^{hb_{ij}}$ is an all-zero matrix of size Z×Z; otherwise, $P^{hb_{ij}}$ is a non-negative integer power of the standard permutation matrix P, and the standard permutation matrix P is shown as follows:

$$P = \begin{bmatrix} 0 & 1 & 0 & \cdots & 0 \\ 0 & 0 & 1 & \cdots & 0 \\ \cdots & \cdots & \cdots & \cdots & \cdots \\ 0 & 0 & 0 & \cdots & 1 \\ 1 & 0 & 0 & \cdots & 0 \end{bmatrix}.$$

By this definition, Z and power $hb_{ij}$ can uniquely identify each block matrix. If a block matrix is an all 0 matrix, it can be represented by "−1", null, or other forms. If a block matrix is obtained by a cyclic shift s of the unit matrix, then it can be represented by s. All $hb_{ij}$ can form a quasi-cyclic LDPC-coded base matrix Hb, and the base matrix Hb of the LDPC code may be expressed as follows:

$$Hb = \begin{bmatrix} hb_{11} & h_{12} & h_{13} & \cdots & hb_{1N} \\ hb_{21} & hb_{22} & h_{23} & \cdots & hb_{2N} \\ \cdots & \cdots & \cdots & & \cdots \\ hb_{M1} & hb_{M2} & hb_{M3} & \cdots & hb_{MN} \end{bmatrix}.$$

Therefore, the base matrix Hb contains two types of elements: elements that indicate the all-zero square matrices; and elements that indicate the sizes of cyclic shift relative to the unit matrix, which are generally expressed as integers between 0 and (Z−1). The base matrix Hb may be referred to as a basic check matrix or a shift value matrix or a permutation value matrix. In Hb, if each element representing an all-zero matrix is replaced with a "0" element, and if each of the other elements is replaced by a "1" element, a quasi-cyclic LDPC-encoded template matrix (called base graph or BG) can be obtained. The base matrix Hb of the quasi-cyclic LDPC code can be determined according to the base graph of the quasi-cyclic LDPC code and a set of shift values (or coefficients). The dimension Z of the basic permutation matrix or the all-zero square matrix may be defined as a shift size, a lifting size, an expansion factor, or a sub-matrix size.

Therefore, the structured LDPC code can be uniquely determined by the base check matrix Hb and the lifting size Z. For example, a base matrix Hb (2 rows and 4 columns) is shown as follows, where the corresponding lift size z is equal to 4.

$$Hb = \begin{bmatrix} 0 & 1 & 0 & -1 \\ 2 & 1 & 2 & 1 \end{bmatrix}$$

The corresponding base graph (BG) is:

$$BG = \begin{bmatrix} 1 & 1 & 1 & 0 \\ 1 & 1 & 1 & 1 \end{bmatrix}$$

The parity check matrix H is obtained from the base matrix Hb and the lifting size Z, as follows:

$$H = \left[\begin{array}{cccc|cccc|cccc|cccc} 1 & 0 & 0 & 0 & 0 & 1 & 0 & 0 & 1 & 0 & 0 & 0 & 0 & 0 & 0 & 0 \\ 0 & 1 & 0 & 0 & 0 & 0 & 1 & 0 & 0 & 1 & 0 & 0 & 0 & 0 & 0 & 0 \\ 0 & 0 & 1 & 0 & 0 & 0 & 0 & 1 & 0 & 0 & 1 & 0 & 0 & 0 & 0 & 0 \\ 0 & 0 & 0 & 1 & 1 & 0 & 0 & 0 & 0 & 0 & 0 & 1 & 0 & 0 & 0 & 0 \\ \hline 0 & 0 & 1 & 0 & 0 & 1 & 0 & 0 & 0 & 0 & 1 & 0 & 0 & 1 & 0 & 0 \\ 0 & 0 & 0 & 1 & 0 & 0 & 1 & 0 & 0 & 0 & 0 & 1 & 0 & 0 & 1 & 0 \\ 1 & 0 & 0 & 0 & 0 & 0 & 0 & 1 & 1 & 0 & 0 & 0 & 0 & 0 & 0 & 1 \\ 0 & 1 & 0 & 0 & 1 & 0 & 0 & 0 & 0 & 1 & 0 & 0 & 1 & 0 & 0 & 0 \end{array}\right].$$

In the quasi-cyclic LDPC coding process, it can be directly coded according to the parity check matrix determined by the base matrix Hb and the lifting size Z. According to the definition of the LDPC code, H×C=0 is satisfied. H includes [Hs Hp], where Hs is the system column partial matrix of the parity check matrix, and Hp is the check column partial matrix of the parity check matrix. C may include [Cs Cp], where Cs is the system bit sequence of the LDPC code (information bits, known bits), and Cp is the parity bit sequence (unknown bit) of the LDPC code. The LDPC coding process is the process of calculating the parity bit sequence. Further, Hs×Cs=Hp×Cp. Then, the parity bit sequence can be calculated as Cp=Hp$^{-1}$×Hs×Cs, so the check column partial matrix of the parity check matrix must be square and be binary reversible. Then, the quasi-cyclic LDPC coding sequence can be obtained as [Cs Cp]. Alternatively, the quasi-cyclic LDPC coding sequence can also be calculated according to the cyclic shift of each Z-bit block.

The present teaching discloses a method for selecting starting bit based on redundancy version (RV) in rate matching. For different RVs, the starting bit locations may not be evenly distributed. One possible goal of selecting starting bit locations may be to avoid transmitting repetitive bits for different RVs.

The present teaching also discloses a method for retransmission of LDPC coded data. After receiving a feedback signal indicating a retransmission is needed, the transmitting end may re-select a new starting bit location based on a scheme corresponding to a RV that is determined based on the feedback signal.

In addition, the present teaching discloses an interleaving method to interleave the bit sequences after rate matching, e.g. based on block interleaving, where the number of rows of the block interleaver is equal to positive integer multiple of the modulation order. The block interleaver may also perform column permutations according to a predetermined column index sequence, to further mix information bits and parity bits and improve average transmission performance. In one embodiment, the predetermined column index sequence has a length that is less than or equal to the number of columns of the block interleaver.

The methods disclosed herein for processing quasi-cyclic LDPC coded data can be applied to a new radio access technology (NR) communication system, an LTE mobile communication system, a fifth generation (5G) mobile communication system, or other wireless/wired communication system. The methods may be applied to either downlink transmission (for the base station to transmit data to the mobile user) or uplink transmission (for the mobile user to transmit data to the base station). In the present teaching, mobile users may refer to: mobile devices, access terminals, user terminals, subscriber stations, subscriber units, mobile stations, remote stations, remote terminals, user agents, user equipment, user devices, or some other terminology; and a base station may refer to: an access point (AP), a Node B, a radio network controller (RNC), an evolved Node B (eNB), a base station controller (BSC), a Base Transceiver Station (BTS), a Base Station (BS), a Transceiver Function (TF), a Radio Router, a Radio Transceiver, a Basic Service Unit, an Extended Service Unit, a radio base station (RBS), or some other terminology. The quasi-cyclic LDPC coded data processing method disclosed in the present teaching can be applied to the following scenarios in a new radio access technology (new RAT): an Enhanced Mobile Broadband (eMBB) scenario, a Ultra-Reliable and Low Latency Communications (URLLC) scenario, or a massive machine type communication (mMTC) scenario.

FIG. 1 illustrates an exemplary rate matching scheme 100 for LDPC code with a circular buffer 110, in accordance with some embodiments of the present disclosure. As shown in FIG. 1, in this embodiment, the first 2Z bits of the LDPC encoded bits are not included in the circular buffer 110. The circular buffer 110 includes a circular bit sequence that serves as a master bit sequence from which a to-be-transmitted bit sequence may be selected for transmission. The to-be-transmitted bit sequence is a sub-sequence of the master bit sequence and starts from a position corresponding to a current RV index. In this example, there are four RVs each of which has a fixed starting bit position in the circular buffer. RV0 corresponds to a starting bit position 0 of the master bit sequence; and the starting bit positions of the other three RVs (RV1, RV2 and RV3) are evenly distributed in the master bit sequence. In one embodiment, RV0 is self-decodable, and the starting position of each RV is an integer multiple of Z. More types of selection of starting bit positions will be described later in the present teaching.

Figure 2:
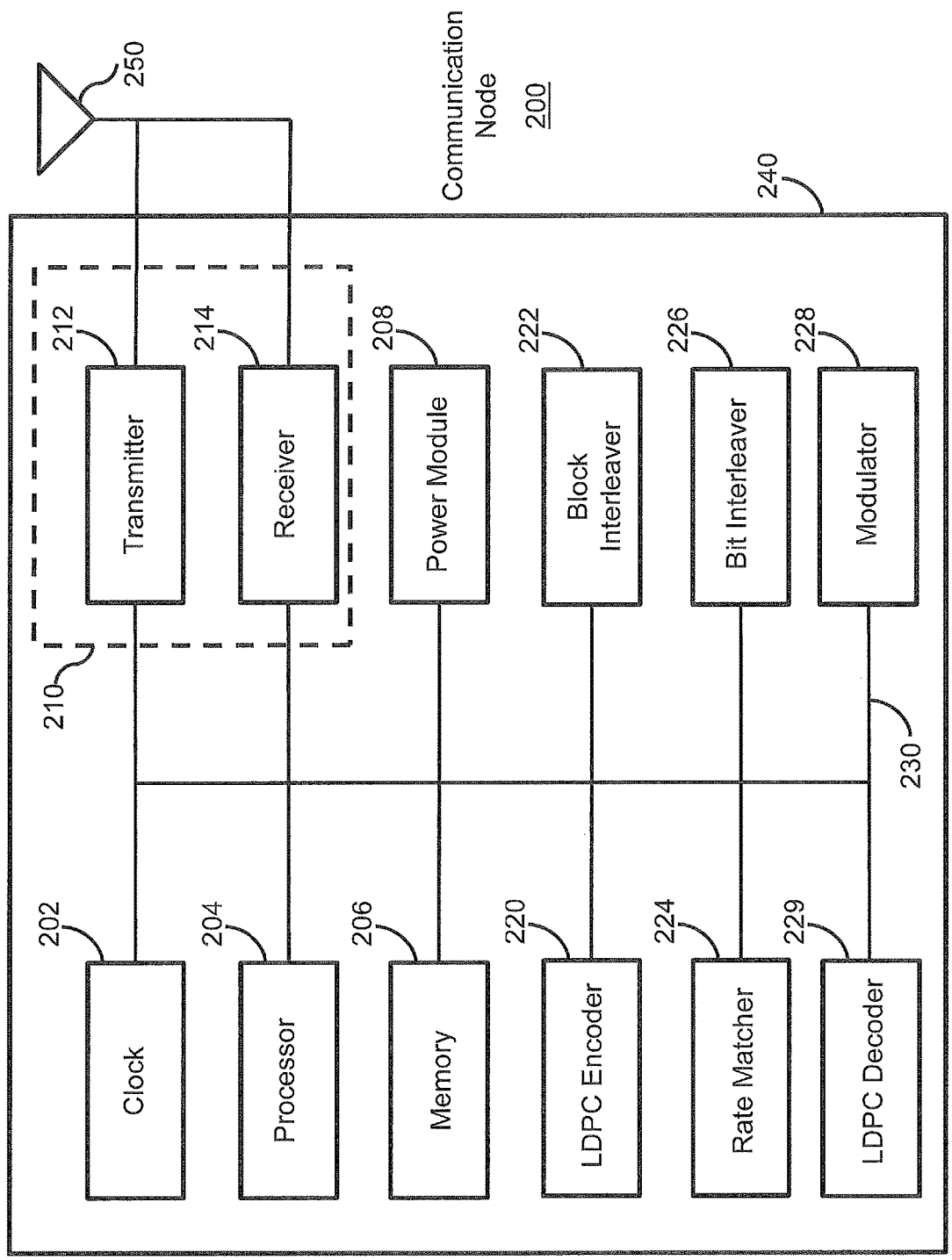
FIG. 2 illustrates a block diagram of a communication node, in accordance with some embodiments of the present disclosure.

FIG. 2 illustrates a block diagram of a communication node 200, in accordance with some embodiments of the present disclosure. The communication node 200 is an example of a device that can be configured to implement the various methods described herein. As shown in FIG. 2, the communication node 200 includes a housing 240 containing a system clock 202, a processor 204, a memory 206, a transceiver 210 comprising a transmitter 212 and receiver 214, a power module 208, an LDPC encoder 220, a block interleaver 222, a rate matcher 224, a bit interleaver 226, a modulator 228, and an LDPC decoder 229.

In this embodiment, the system clock 202 provides the timing signals to the processor 204 for controlling the timing of all operations of the communication node 200. The processor 204 controls the general operation of the communication node 200 and can include one or more processing circuits or modules such as a central processing unit (CPU) and/or any combination of general-purpose microprocessors, microcontrollers, digital signal processors (DSPs), field programmable gate array (FPGAs), programmable logic devices (PLDs), controllers, state machines, gated logic, discrete hardware components, dedicated hardware finite state machines, or any other suitable circuits, devices and/or structures that can perform calculations or other manipulations of data.

The memory 206, which can include both read-only memory (ROM) and random access memory (RAM), can provide instructions and data to the processor 204. A portion of the memory 206 can also include non-volatile random access memory (NVRAM). The processor 204 typically performs logical and arithmetic operations based on program instructions stored within the memory 206. The instructions (a.k.a., software) stored in the memory 206 can be executed by the processor 204 to perform the methods described herein. The processor 204 and memory 206 together form a processing system that stores and executes software. As used herein, "software" means any type of instructions, whether referred to as software, firmware, middleware, microcode, etc. which can configure a machine or device to perform one or more desired functions or processes. Instructions can include code (e.g., in source code format, binary code format, executable code format, or any other suitable format of code). The instructions, when executed by the one or more processors, cause the processing system to perform the various functions described herein.

The transceiver 210, which includes the transmitter 212 and receiver 214, allows the communication node 200 to transmit and receive data to and from a remote device (e.g., the BS or another UE). An antenna 250 is typically attached to the housing 240 and electrically coupled to the transceiver 210. In various embodiments, the communication node 200 includes (not shown) multiple transmitters, multiple receivers, multiple transceivers, and/or multiple antennas. The transmitter 212 can be configured to wirelessly transmit packets having different packet types or functions, such packets being generated by the processor 204. Similarly, the receiver 214 is configured to receive packets having different packet types or functions, and the processor 204 is configured to process packets of a plurality of different packet types. For example, the processor 204 can be configured to determine the type of packet and to process the packet and/or fields of the packet accordingly.

The 200 may be a base station or a mobile user in a wireless network. The 200 can serve as a transmitting end and/or a receiving end in a wireless communication. When the communication node 200 serves as a transmitting end, the LDPC encoder 220 can encode an information bit sequence based on an LDPC coding scheme to obtain an encoded bit sequence. The LDPC encoding may be based on a base matrix Hb and a lifting size Z. The information bit sequence includes information bits carrying original information the communication node 200 wants to transmit. The encoded bit sequence includes both information bits carrying the original information and parity bits for error correction. The 220 may send the encoded bit sequence, which may be referred as a codeword, to the rate matcher 224 for rate matching.

The 224 in this example can perform rate matching to resize the codeword for transmission over the channel, in order to match a transmission rate consistent with the allocated transmission resources by the communication system. The 224 can generate a master bit sequence based on the encoded bit sequence. As previously shown in FIG. 1, an exemplary master bit sequence may be obtained by removing some heading bits in the encoded bit sequence and storing the remaining bits into a circular buffer. It can be understood that a master bit sequence may also be generated according to other methods based on the encoded bit sequence. The master bit sequence serves as a master or mother LDPC codeword for the rate matcher 224 to select a portion of it for transmission according to the rate matching rule or the transmission rate requirement. In one embodiment, for each transmission, the rate matcher 224 selects a subset of the master bit sequence to obtain a rate matched bit sequence, based on a redundancy version that is included in a set of redundancy versions. The 224 can send each rate matched bit sequence to the bit interleaver 226 and/or the block interleaver 222 for interleaving.

The 226 may perform a bit-level interleaving on the rate matched bit sequence to enhance LDPC coding performance, especially for high order modulation. For example, the bit interleaver 226 may interleave the rate matched bit sequence according to a predetermined index sequence to obtain a to-be-transmitted bit sequence.

In one embodiment, the block interleaver 222 may determine the predetermined index sequence for the bit interleaver 226 based on a matrix having $R_{subblock}$ number of rows. To adapt to high order modulations, $R_{subblock}$ is chosen to be a positive integer multiple of the modulation order. For example, $R_{subblock}$ may be 16, 32, 48, 64, etc. for a 16 QAM modulation.

In addition, the block interleaver 222 may perform column permutations on the matrix before the to-be-transmitted bit sequence is obtained. The column permutations may be performed according to a predetermined column index sequence. In one embodiment, the predetermined column index sequence has a length that is less than or equal to the number of columns of the matrix of the block interleaver 222. The 226 or the block interleaver 222 may send the to-be-transmitted bit sequence after interleaving to the modulator 228 for modulation and transmission.

The 228 can modulate the to-be-transmitted bit sequence to obtain a modulated symbol sequence according to a modulation order that is a positive integer, e.g. 16 QAM, 64 QAM, 256 QAM, etc. The 228 then transmits, via the transmitter 212, the modulated symbol sequence to another communication node that serves as a receiving end.

When the communication node 200 serves as a receiving end, the modulator 228 can receive, via the receiver 214, a modulated symbol sequence from another communication node that serves as a transmitting end. In one embodiment, the modulator 228 may demodulate the modulated symbol sequence according to the modulation order to obtain a bit sequence, and send the bit sequence to the LDPC decoder 229 for decoding. In another embodiment, the communication node 200 further includes a separate demodulator (not shown) for demodulating the modulated symbol sequence according to the modulation order to obtain a bit sequence, and send the bit sequence to the LDPC decoder 229 for decoding.

The 229 may try to decode the bit sequence based on the LDPC coding scheme to obtain the original information bits sent by the transmitting end. During the decoding, the LDPC decoder 229 can determine whether there is transmission error of the modulated symbol sequence, e.g. based on the parity bits in the bit sequence. According to the decoding result, the LDPC decoder 229 may generate a feedback signal associated with the bit sequence. For example, the feedback signal may indicate an acknowledgement (ACK), a negative acknowledgement (NACK), or a discontinuous transmission (DTX). The 229 can transmit, via the transmitter 212, the feedback signal to the transmitting end.

When the communication node 200 serves as a transmitting end, the rate matcher 224 may receive, via the receiver 214, the feedback signal, associated with a previously transmitted bit sequence, from the receiving end. In one embodiment, the rate matcher 224 may reselect a subset of the master bit sequence based on a scheme corresponding to a RV that is determined based on the feedback signal. Then, the rate matcher 224 can send the reselected bit sequence, that is rate matched, to the bit interleaver 226 for bit interleaving. After the bit interleaver 226 performs bit interleaving, e.g. based on block interleaving and column permutations of the block interleaver 222 according to the modulation order, the modulator 228 can perform modulation and retransmission, via the transmitter 212, to the receiving end.

The power module 208 can include a power source such as one or more batteries, and a power regulator, to provide regulated power to each of the above-described modules in FIG. 2. In some embodiments, if the communication node 200 is coupled to a dedicated external power source (e.g., a wall electrical outlet), the power module 208 can include a transformer and a power regulator.

The various modules discussed above are coupled together by a bus system 230. The bus system 230 can include a data bus and, for example, a power bus, a control signal bus, and/or a status signal bus in addition to the data bus. It is understood that the modules of the communication node 200 can be operatively coupled to one another using any suitable techniques and mediums.

Although a number of separate modules or components are illustrated in FIG. 2, persons of ordinary skill in the art will understand that one or more of the modules can be combined or commonly implemented. For example, the processor 204 can implement not only the functionality described above with respect to the processor 204, but also implement the functionality described above with respect to the LDPC encoder 220. Conversely, each of the modules illustrated in FIG. 2 can be implemented using a plurality of separate components or elements.

Figure 3:
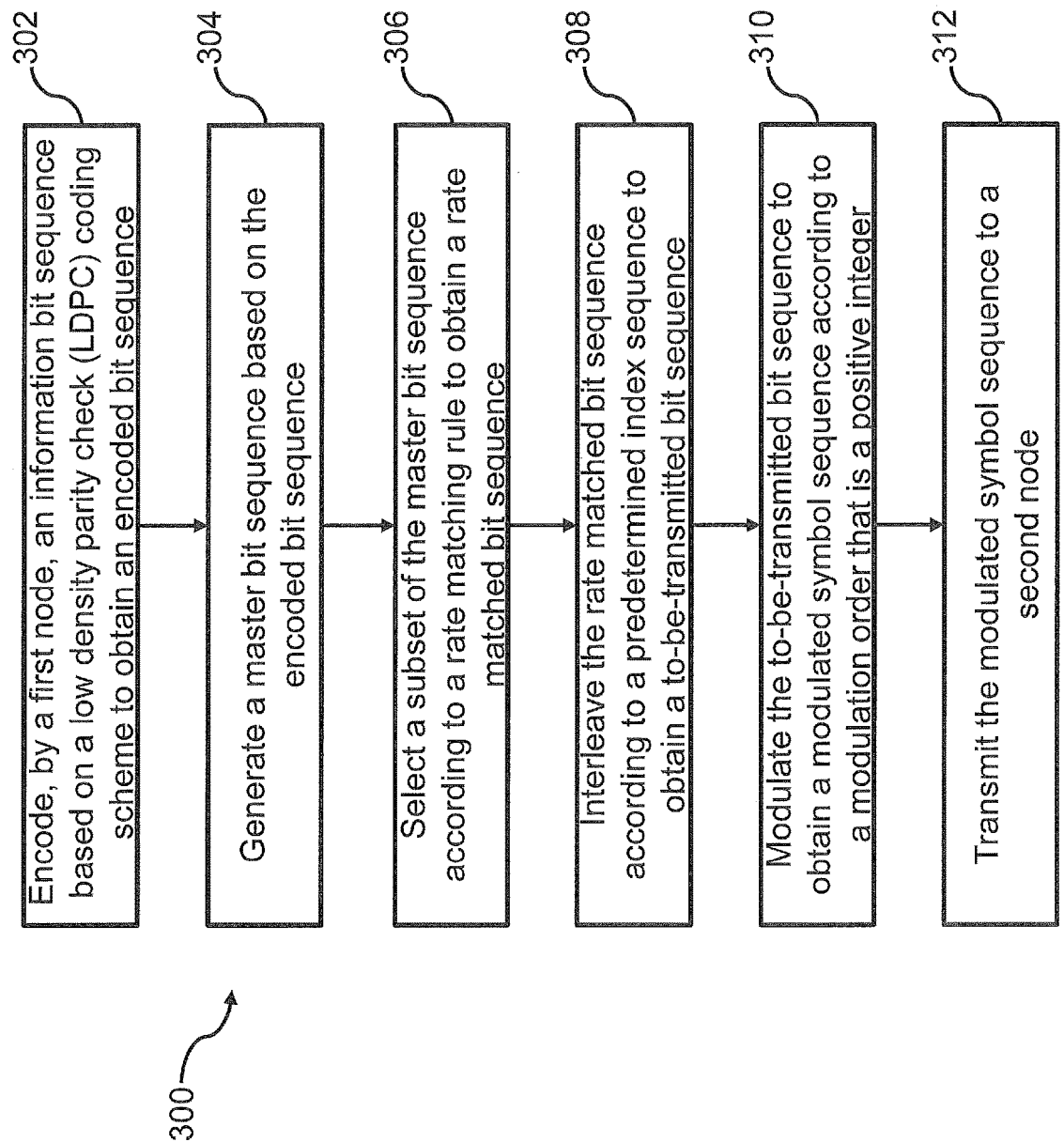
FIG. 3 illustrates a flow chart for a method performed by a communication node for transmitting data encoded by LDPC, in accordance with some embodiments of the present disclosure.

FIG. 3 illustrates a flow chart for a method 300 performed by a communication node, e.g. the communication node 200 as shown in FIG. 2, for transmitting data encoded by LDPC, in accordance with some embodiments of the present disclosure. At 302, a communication node, referred to as the first node, encodes an information bit sequence based on an LDPC coding scheme to obtain an encoded bit sequence.

The first node generates at 304 a master bit sequence based on the encoded bit sequence. The first node selects at 306 a subset of the master bit sequence according to a rate matching rule to obtain a rate matched bit sequence. At 308, the first node interleaves the rate matched bit sequence according to a predetermined index sequence to obtain a to-be-transmitted bit sequence. The first node then modulates at 310 the to-be-transmitted bit sequence to obtain a modulated symbol sequence according to a modulation order that is a positive integer. The first node transmits at 312 the modulated symbol sequence to a second node.

Figure 4:
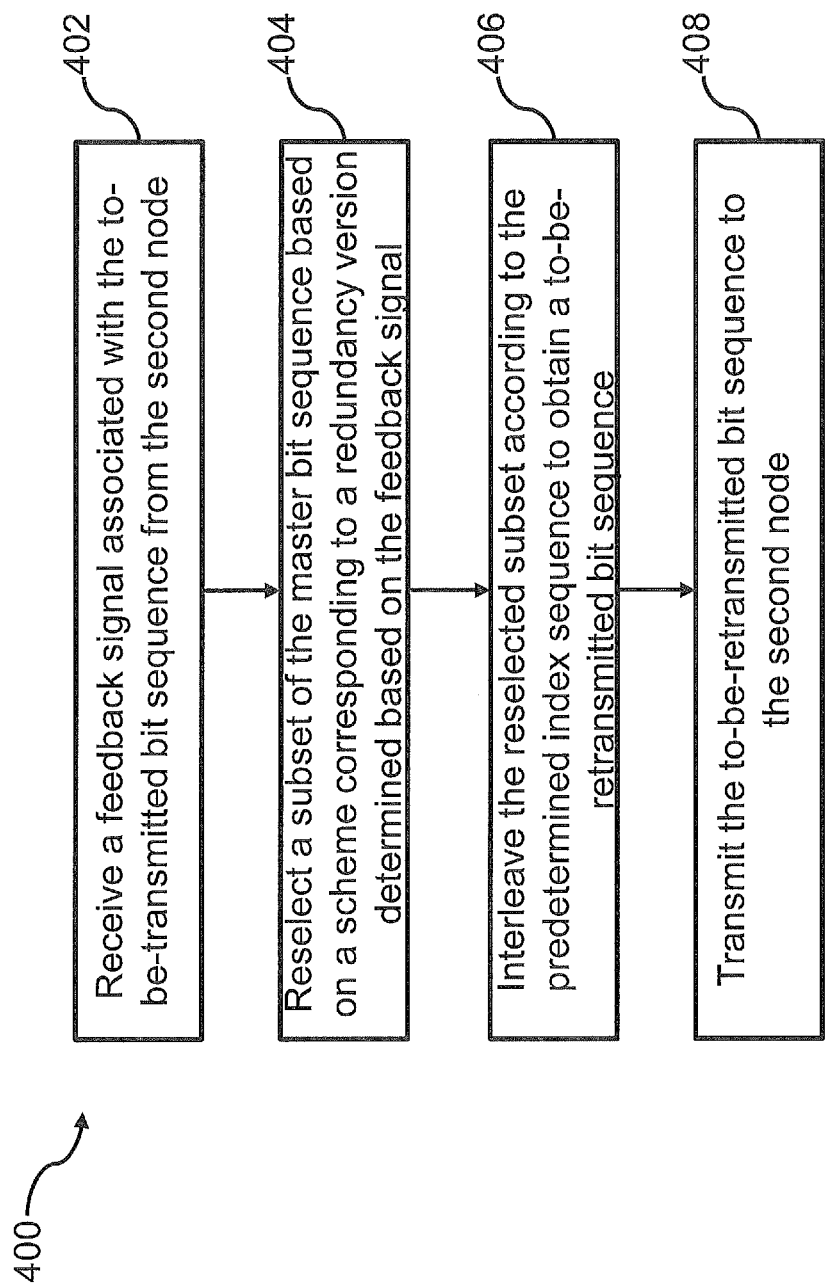
FIG. 4 illustrates a flow chart for a method performed by a communication node for retransmitting data encoded by LDPC, in accordance with some embodiments of the present disclosure.

FIG. 4 illustrates a flow chart for a method 400 performed by a communication node e.g. the communication node 200 as shown in FIG. 2, for retransmitting data encoded by LDPC, in accordance with some embodiments of the present disclosure. At 402, the first node receives a feedback signal associated with the to-be-transmitted bit sequence from the second node. The first node reselects at 404 a subset of the master bit sequence based on a scheme corresponding to a redundancy version determined based on the feedback signal. The first node interleaves at 406 the reselected subset according to the predetermined index sequence to obtain a to-be-retransmitted bit sequence. The first node transmits at 408 the to-be-retransmitted bit sequence to the second node.

Figure 5:
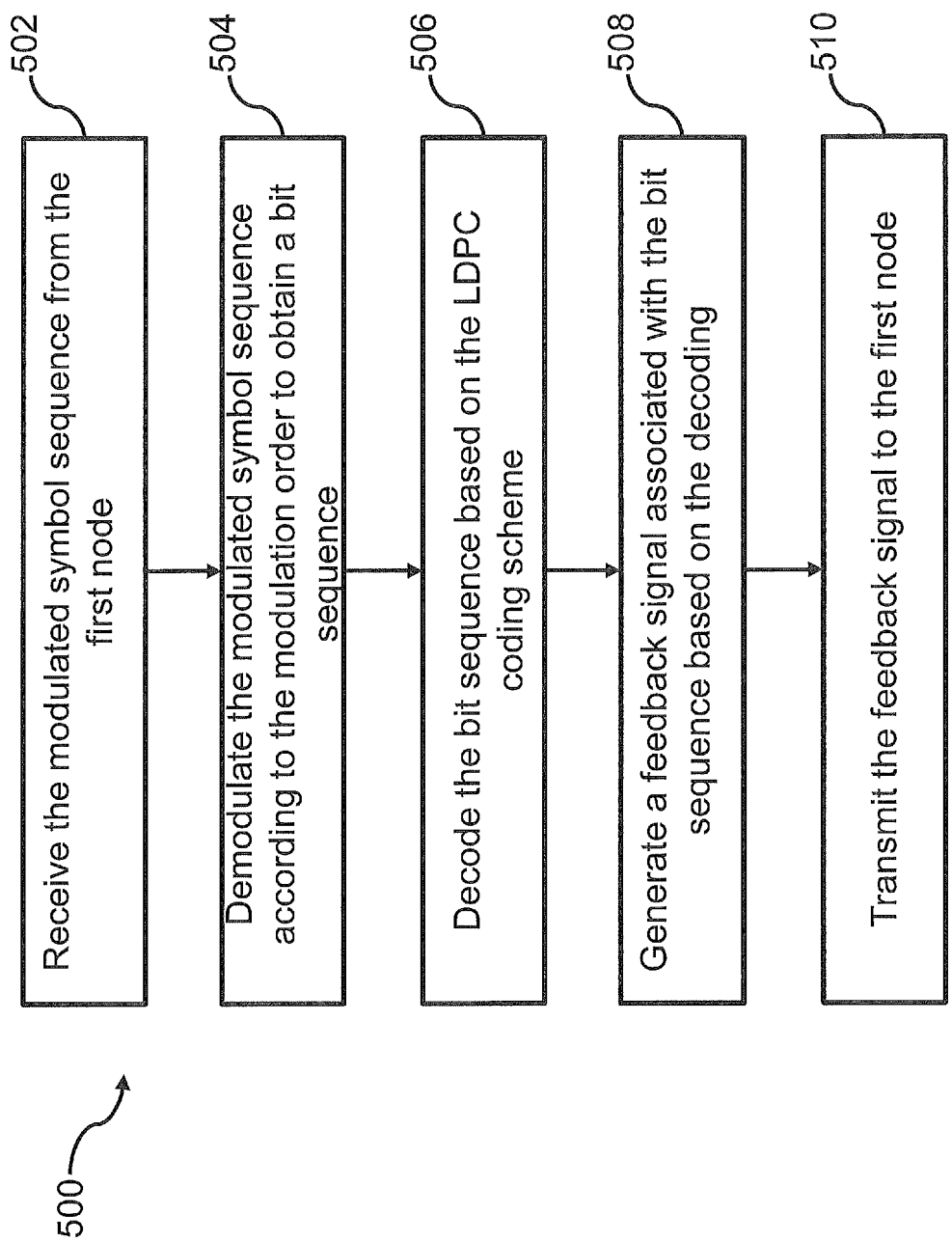
FIG. 5 illustrates a flow chart for a method performed by a communication node for receiving and decoding data encoded by LDPC, in accordance with some embodiments of the present disclosure.

FIG. 5 illustrates a flow chart for a method 500 performed by a communication node e.g. the communication node 200 as shown in FIG. 2, for receiving and decoding data encoded by LDPC, in accordance with some embodiments of the present disclosure. At 502, a communication node, referred to as the second node, receives the modulated symbol sequence from the first node. The second node demodulates at 504 the modulated symbol sequence according to the modulation order to obtain a bit sequence. The second node decodes at 506 the bit sequence based on the LDPC coding scheme. The second node generates at 508 a feedback signal associated with the bit sequence based on the decoding. The second node transmits at 510 the feedback signal to the first node.

Different embodiments of the present disclosure will now be described in detail hereinafter. It is noted that the features of the embodiments and examples in the present disclosure may be combined with each other in any manner without conflict.

In one embodiment, a method performed by a first node is disclosed. An information bit sequence is encoded based on an LDPC coding scheme to obtain an encoded bit sequence. The information bit sequence is encoded based on a base matrix Hb and a lifting size Z. The first node then generates a master bit sequence based on the encoded bit sequence. The master bit sequence includes Ncb bits (0 to Ncb−1) that are selected from bits 2*Z to 2*Z+Ncb−1 in the encoded bit sequence. The first node selects a subset of the master bit sequence according to a rate matching rule to obtain a rate matched bit sequence. In one example, the subset of the master bit sequence is selected based on a redundancy version that is included in a set of redundancy versions comprising at least (RV0, RV1, RV2, and RV3). The first node interleaves the rate matched bit sequence according to a predetermined index sequence to obtain a to-be-transmitted bit sequence; and transmits the to-be-transmitted bit sequence to a second node.

In one embodiment, the first node modulates the to-be-transmitted bit sequence to obtain a modulated symbol sequence according to a modulation order that is a positive integer; and transmits the modulated symbol sequence to the second node. The predetermined index sequence is determined based on a block interleaver that has $R_{subblock}$ number of rows, where $R_{subblock}$ is a positive integer multiple of the modulation order. The to-be-transmitted bit sequence is obtained based on column permutations performed by the block interleaver according to a predetermined column index sequence.

In one embodiment, the rate matched bit sequence is obtained based on at least one of the following schemes, each of which corresponds to at least one of the redundancy versions in the set of redundancy versions: scheme 1: selecting a sub-sequence starting from bit 0 in the master bit sequence; scheme 2: selecting a sub-sequence starting from bit (function($\alpha \times Ncb/(\beta \times 3 \times Z))+\delta) \times Z$ in the master bit sequence, wherein $\alpha$ is a positive real number, $\beta$ is a positive real number, $\delta$ is an integer greater than −10 and less than 10, and function(•) means taking a closest upper integer, taking a closest lower integer, or taking an integer by rounding; scheme 3: selecting a sub-sequence starting from bit (function($\alpha \times Ncb/(\beta \times 3 \times Z)) \times 2+\delta) \times Z$ in the master bit sequence; scheme 4: selecting a sub-sequence starting from bit Ncb−x0 in the master bit sequence, wherein x0 is a positive integer less than Ncb/4; scheme 5: selecting a sub-sequence starting from bit x1 in the master bit sequence, wherein x1 is determined based on R max, and R max is a real number greater than 0.8 and less than 1; scheme 6: interleaving the master bit sequence to generate an interleaved master bit sequence and selecting a sub-sequence starting from bit x2 in the interleaved master bit sequence, wherein x2 is a non-negative integer less than Ncb; and scheme 7: selecting a sub-sequence starting from bit A3×Z in the master bit sequence, wherein A3 is an integer and satisfies Ncb/(4×Z)≤A3≤Ncb/(2×Z).

In one embodiment, the set of redundancy versions comprise at least four redundancy versions (RV0, RV1, RV2, and RV3) and at most two of the redundancy versions RV1, RV2, and RV3 correspond to the scheme 6. When two of the redundancy versions RV1, RV2, and RV3 correspond to the scheme 6, the two redundancy versions correspond to two different values of x2. In one embodiment, at least one of the redundancy versions RV1, RV2, and RV3 correspond to at least one of the scheme 2 and the scheme 3.

In one embodiment, the redundancy version RV0 corresponds to the scheme 1; the redundancy version RV1 corresponds to at least one of the scheme 2, the scheme 5, and the scheme 7; the redundancy version RV2 corresponds to the scheme 3; and the redundancy version RV3 corresponds to at least one of the scheme 4 and the scheme 6.

A transmitting end may retransmit data when either one of the two states happens: a NACK state and a DTX state. The NACK state means the transmitting end is sure that the receiving end has received the data but the receiving end did not decode correctly. As such, the transmitting end may retransmit more parity bits to obtain performance gain for the NACK state.

The DTX state means that the transmitting end is not sure whether the receiving end has received the data or not. For the DTX state, in case that the receiving end has not received the data and there was decoding error, the transmitting end can retransmit the data of RV0. But in case that the receiving end has received the data but there was decoding error, retransmission of the data of other redundancy versions will provide more performance gain. Therefore, for DTX state, it is better for one of the redundancy versions to be defined with a self-decodable feature. A self-decodable RV can satisfactorily solve the problem of the DTX state. In one embodiment, for DTX state, at least one of [RV1, RV2, RV3] is self-decodable and contains additional parity bits that are not in RV0.

In one embodiment, the first node receives a NACK signal associated with the to-be-transmitted bit sequence from the second node; reselects a subset of the master bit sequence based on a scheme corresponding to at least one of the redundancy version RV1 and the redundancy version RV2; interleaves the reselected subset according to the predetermined index sequence to obtain a to-be-retransmitted bit sequence; and transmits the to-be-retransmitted bit sequence to the second node. The redundancy versions RV1 and RV2 here can carry more parity bits, with a smaller effective code rate for retransmission data, to achieve performance gain for the retransmission. But the redundancy versions RV1 and RV2 may not be self-decodable.

In another embodiment, the first node receives a DTX signal associated with the to-be-transmitted bit sequence from the second node; reselects a subset of the master bit sequence based on a scheme corresponding to at least one of the redundancy version RV0 and the redundancy version RV3; interleaves the reselected subset according to the predetermined index sequence to obtain a to-be-retransmitted bit sequence; and transmits the to-be-retransmitted bit sequence to the second node. The redundancy versions RV0 and RV3 here are self-decodable, such that the receiving end can directly decode the retransmitted data without receiving the previously transmitted data.

In one embodiment, the information bit sequence is encoded based on a quasi-cyclic LDPC code, and the parity check matrix in the quasi-cyclic LDPC code has two types of base graphs: base graph 1 (BG1) and base graph 2 (BG2). The BG1 includes 46 rows and 68 columns; and the BG2 includes 42 rows and 52 columns. Table 1 shows the "1" positions corresponding to the row index of i, in the base graph matrices (BG1 and BG2). That is, the "1" positions can be replaced by a cyclic permutation unit matrix. Note: in Table 1, the first column corresponds to an indication of the row index i of the BG1 and the BG2; the second column corresponds to an indication of the column index j of the BG1, where the combination of i and j [i,j] determines the "1" position of the BG1; and the third column corresponds to an indication of column index j of the BG2, where the combination of i and j [i,j] determines the "1" position of the BG2. Table 2 and Table 3 respectively illustrate the eight shift value matrices corresponding to the BG1, and the eight shift value matrices corresponding to the BG2, where i is used to indicate the row index, j is used to indicate the column index, and $i_{L,S}$ is the index number corresponding to the set of lifting sizes. Table 4 corresponds to the lifting sizes supported by the BG1 and the BG2, including eight sets of lifting sizes, where the index numbers of the eight sets of lifting sizes are in the order of 0 to 7. A base graph matrix can be determined based on the length information of the information packet and the rate information of the quasi-cyclic LDPC code. For example, if the length information is less than or equal to 3840 and the quasi-cyclic LDPC code rate is less than or equal to ⅔, then the BG2 is selected; otherwise, the BG1 is selected. One can determine lifting size Z of the quasi-cyclic LDPC code from the Table 4 based on the length information of the information packet and the system column number information of the base graph matrix. For example, selecting a lifting size (as Z) greater than or equal to K/kb from the Table 4; obtaining an index of a corresponding set of lifting sizes according to the lifting size Z; then the shift-value matrix can be determined from Table 2 or Table 3 based on the index, and then the base matrix Hb corresponding to the lift value Z can be obtained according to the formula $P_{i,j}=\text{mod}(V_{i,j}, Z)$, where $V_{i,j}$ is the element at the i-th row and the j-th column of the shift-value matrix, and $P_{i,j}$ is the element at the i-th row and the j-th column of the base matrix Hb; the information packet bit sequence can be encoded using the quasi-cyclic LDPC code according to the lifting size Z and the base matrix Hb.

TABLE 1

Base Graph 1 and Base Graph 2

| Row index (i) | Column indices (j) of every element of value 1 for BG1 | Column indices (j) of every element of value 1 for BG2 |
|---|---|---|
| 0 | 0, 1, 2, 3, 5, 6, 9, 10, 11, 12, 13, 15, 16, 18, 19, 20, 21, 22, 23 | 0, 1, 2, 3, 6, 9, 10, 11 |
| 1 | 0, 2, 3, 4, 5, 7, 8, 9, 11, 12, 14, 15, 16, 17, 19, 21, 22, 23, 24 | 0, 3, 4, 5, 6, 7, 8, 9, 11, 12 |
| 2 | 0, 1, 2, 4, 5, 6, 7, 8, 9, 10, 13, 14, 15, 17, 18, 19, 20, 24, 25 | 0, 1, 3, 4, 8, 10, 12, 13 |
| 3 | 0, 1, 3, 4, 6, 7, 8, 10, 11, 12, 13, 14, 16, 17, 18, 20, 21, 22, 25 | 1, 2, 4, 5, 6, 7, 8, 9, 10, 13 |
| 4 | 0, 1, 26 | 0, 1, 11, 14 |
| 5 | 0, 1, 3, 12, 16, 21, 22, 27 | 0, 1, 5, 7, 11, 15 |
| 6 | 0, 6, 10, 11, 13, 17, 18, 20, 28 | 0, 5, 7, 9, 11, 16 |
| 7 | 0, 1, 4, 7, 8, 14, 29 | 1, 5, 7, 11, 13, 17 |
| 8 | 0, 1, 3, 12, 16, 19, 21, 22, 24, 30 | 0, 1, 12, 18 |
| 9 | 0, 1, 10, 11, 13, 17, 18, 20, 31 | 1, 8, 10, 11, 19 |
| 10 | 1, 2, 4, 7, 8, 14, 32 | 0, 1, 6, 7, 20 |
| 11 | 0, 1, 12, 16, 21, 22, 23, 33 | 0, 7, 9, 13, 21 |
| 12 | 0, 1, 10, 11, 13, 18, 34 | 1, 3, 11, 22 |
| 13 | 0, 3, 7, 20, 23, 35 | 0, 1, 8, 13, 23 |
| 14 | 0, 12, 15, 16, 17, 21, 36 | 1, 6, 11, 13, 24 |
| 15 | 0, 1, 10, 13, 18, 25, 37 | 0, 10, 11, 25 |
| 16 | 1, 3, 11, 20, 22, 38 | 1, 9, 11, 12, 26 |
| 17 | 0, 14, 16, 17, 21, 39 | 1, 5, 11, 12, 27 |
| 18 | 1, 12, 13, 18, 19, 40 | 0, 6, 7, 28 |
| 19 | 0, 1, 7, 8, 10, 41 | 0, 1, 10, 29 |
| 20 | 0, 3, 9, 11, 22, 42 | 1, 4, 11, 30 |
| 21 | 1, 5, 16, 20, 21, 43 | 0, 8, 13, 31 |
| 22 | 0, 12, 13, 17, 44 | 1, 2, 32 |
| 23 | 1, 2, 10, 18, 45 | 0, 3, 5, 33 |
| 24 | 0, 3, 4, 11, 22, 46 | 1, 2, 9, 34 |
| 25 | 1, 6, 7, 14, 47 | 0, 5, 35 |
| 26 | 0, 2, 4, 15, 48 | 2, 7, 12, 13, 36 |
| 27 | 1, 6, 8, 49 | 0, 6, 37 |
| 28 | 0, 4, 19, 21, 50 | 1, 2, 5, 38 |
| 29 | 1, 14, 18, 25, 51 | 0, 4, 39 |
| 30 | 0, 10, 13, 24, 52 | 2, 5, 7, 9, 40 |
| 31 | 1, 7, 22, 25, 53 | 1, 13, 41 |
| 32 | 0, 12, 14, 24, 54 | 0, 5, 12, 42 |
| 33 | 1, 2, 11, 21, 55 | 2, 7, 10, 43 |
| 34 | 0, 7, 15, 17, 56 | 0, 12, 13, 44 |
| 35 | 1, 6, 12, 22, 57 | 1, 5, 11, 45 |
| 36 | 0, 14, 15, 18, 58 | 0, 2, 7, 46 |
| 37 | 1, 13, 23, 59 | 10, 13, 47 |
| 38 | 0, 9, 10, 12, 60 | 1, 5, 11, 48 |
| 39 | 1, 3, 7, 19, 61 | 0, 7, 12, 49 |
| 40 | 0, 8, 17, 62 | 2, 10, 13, 50 |
| 41 | 1, 3, 9, 18, 63 | 1, 5, 11, 51 |
| 42 | 0, 4, 24, 64 | |
| 43 | 1, 16, 18, 25, 65 | |
| 44 | 0, 7, 9, 22, 66 | |
| 45 | 1, 6, 10, 67 | |

TABLE 2

Shift values for BG1

| i | j | $i_{LS}$ 0 | 1 | 2 | 3 | 4 | 5 | 6 | 7 |
|---|---|---|---|---|---|---|---|---|---|
| 0 | 0 | 250 | 307 | 73 | 223 | 211 | 294 | 0 | 135 |
|   | 1 | 69 | 19 | 15 | 16 | 198 | 118 | 0 | 227 |
|   | 2 | 226 | 50 | 103 | 94 | 188 | 167 | 0 | 126 |
|   | 3 | 159 | 369 | 49 | 91 | 186 | 330 | 0 | 134 |
|   | 5 | 100 | 181 | 240 | 74 | 219 | 207 | 0 | 84 |
|   | 6 | 10 | 216 | 39 | 10 | 4 | 165 | 0 | 83 |
|   | 9 | 59 | 317 | 15 | 0 | 29 | 243 | 0 | 53 |
|   | 10 | 229 | 288 | 162 | 205 | 144 | 250 | 0 | 225 |
|   | 11 | 110 | 109 | 215 | 216 | 116 | 1 | 0 | 205 |
|   | 12 | 191 | 17 | 164 | 21 | 216 | 339 | 0 | 128 |
|   | 13 | 9 | 357 | 133 | 215 | 115 | 201 | 0 | 75 |
|   | 15 | 195 | 215 | 298 | 14 | 233 | 53 | 0 | 135 |
|   | 16 | 23 | 106 | 110 | 70 | 144 | 347 | 0 | 217 |
|   | 16 | 190 | 242 | 113 | 141 | 95 | 304 | 0 | 220 |
|   | 19 | 35 | 180 | 16 | 198 | 216 | 167 | 0 | 90 |

TABLE 2-continued

Shift values for BG1

| i | j | $i_{LS}$ 0 | 1 | 2 | 3 | 4 | 5 | 6 | 7 |
|---|---|---|---|---|---|---|---|---|---|
|   | 20 | 239 | 330 | 189 | 104 | 73 | 47 | 0 | 105 |
|   | 21 | 31 | 346 | 32 | 81 | 261 | 188 | 0 | 137 |
|   | 22 | 1 | 1 | 1 | 1 | 1 | 1 | 0 | 1 |
|   | 23 | 0 | 0 | 0 | 0 | 0 | 0 | 0 | 0 |
| 1 | 0 | 2 | 76 | 303 | 141 | 179 | 77 | 22 | 96 |
|   | 2 | 239 | 76 | 294 | 45 | 162 | 225 | 11 | 236 |
|   | 3 | 117 | 73 | 27 | 151 | 223 | 96 | 124 | 136 |
|   | 4 | 124 | 288 | 261 | 46 | 256 | 338 | 0 | 221 |
|   | 5 | 71 | 144 | 161 | 119 | 160 | 268 | 10 | 128 |
|   | 7 | 222 | 331 | 133 | 157 | 76 | 112 | 0 | 92 |
|   | 8 | 101 | 331 | 4 | 133 | 202 | 302 | 0 | 172 |
|   | 9 | 173 | 178 | 80 | 87 | 117 | 50 | 2 | 56 |
|   | 11 | 220 | 295 | 129 | 206 | 109 | 167 | 16 | 11 |
|   | 12 | 102 | 312 | 300 | 93 | 15 | 253 | 60 | 189 |
|   | 14 | 109 | 217 | 76 | 79 | 72 | 334 | 0 | 95 |

TABLE 2-continued

Shift values for BG1

| i | j | 0 | 1 | 2 | 3 | 4 | 5 | 6 | 7 |
|---|---|---|---|---|---|---|---|---|---|
|   | 15 | 132 | 99 | 266 | 9 | 152 | 242 | 6 | 85 |
|   | 16 | 142 | 354 | 72 | 118 | 158 | 257 | 30 | 153 |
|   | 17 | 155 | 114 | 83 | 194 | 147 | 133 | 0 | 87 |
|   | 19 | 255 | 331 | 260 | 31 | 156 | 9 | 168 | 163 |
|   | 21 | 28 | 112 | 301 | 187 | 119 | 302 | 31 | 216 |
|   | 22 | 0 | 0 | 0 | 0 | 0 | 0 | 105 | 0 |
|   | 23 | 0 | 0 | 0 | 0 | 0 | 0 | 0 | 0 |
|   | 24 | 0 | 0 | 0 | 0 | 0 | 0 | 0 | 0 |
| 2 | 0 | 106 | 205 | 68 | 207 | 258 | 226 | 132 | 189 |
|   | 1 | 111 | 250 | 7 | 203 | 167 | 35 | 37 | 4 |
|   | 2 | 185 | 328 | 80 | 31 | 220 | 213 | 21 | 225 |
|   | 4 | 63 | 332 | 280 | 176 | 133 | 302 | 180 | 151 |
|   | 5 | 117 | 256 | 38 | 180 | 243 | 111 | 4 | 236 |
|   | 6 | 93 | 161 | 227 | 186 | 202 | 265 | 149 | 117 |
|   | 7 | 229 | 267 | 202 | 95 | 218 | 128 | 48 | 179 |
|   | 8 | 177 | 160 | 200 | 153 | 63 | 237 | 38 | 92 |
|   | 9 | 95 | 63 | 71 | 177 | 0 | 294 | 122 | 24 |
|   | 10 | 39 | 129 | 106 | 70 | 3 | 127 | 195 | 68 |
|   | 13 | 142 | 200 | 295 | 77 | 74 | 110 | 155 | 6 |
|   | 14 | 225 | 88 | 283 | 214 | 229 | 286 | 28 | 101 |
|   | 15 | 225 | 53 | 301 | 77 | 0 | 125 | 85 | 33 |
|   | 17 | 245 | 131 | 184 | 198 | 216 | 131 | 47 | 96 |
|   | 18 | 205 | 240 | 246 | 117 | 269 | 163 | 179 | 125 |
|   | 19 | 251 | 205 | 230 | 223 | 200 | 210 | 42 | 67 |
|   | 20 | 117 | 13 | 276 | 90 | 234 | 7 | 66 | 230 |
|   | 24 | 0 | 0 | 0 | 0 | 0 | 0 | 0 | 0 |
|   | 25 | 0 | 0 | 0 | 0 | 0 | 0 | 0 | 0 |
| 3 | 0 | 121 | 276 | 220 | 201 | 187 | 97 | 4 | 128 |
|   | 1 | 89 | 87 | 208 | 18 | 145 | 94 | 6 | 23 |
|   | 3 | 84 | 0 | 30 | 165 | 166 | 19 | 33 | 162 |
|   | 4 | 20 | 275 | 197 | 5 | 108 | 279 | 113 | 220 |
|   | 6 | 150 | 199 | 61 | 45 | 82 | 139 | 49 | 43 |
|   | 7 | 131 | 153 | 175 | 142 | 132 | 166 | 21 | 186 |
|   | 8 | 243 | 56 | 79 | 16 | 197 | 91 | 6 | 96 |
|   | 10 | 136 | 132 | 281 | 34 | 41 | 106 | 151 | 1 |
|   | 11 | 86 | 305 | 303 | 155 | 162 | 246 | 83 | 216 |
|   | 12 | 246 | 231 | 253 | 213 | 57 | 345 | 154 | 22 |
|   | 13 | 219 | 341 | 164 | 147 | 36 | 269 | 87 | 24 |
|   | 14 | 211 | 212 | 53 | 69 | 115 | 185 | 5 | 167 |
|   | 16 | 240 | 304 | 44 | 96 | 242 | 249 | 92 | 200 |
|   | 17 | 76 | 300 | 28 | 74 | 165 | 215 | 173 | 32 |
|   | 18 | 244 | 271 | 77 | 99 | 0 | 143 | 120 | 235 |
|   | 20 | 144 | 39 | 319 | 30 | 113 | 121 | 2 | 172 |
|   | 21 | 12 | 357 | 68 | 158 | 108 | 121 | 142 | 219 |
|   | 22 | 1 | 1 | 1 | 1 | 1 | 1 | 0 | 1 |
|   | 25 | 0 | 0 | 0 | 0 | 0 | 0 | 0 | 0 |
| 4 | 0 | 157 | 332 | 233 | 170 | 246 | 42 | 24 | 64 |
|   | 1 | 102 | 181 | 205 | 10 | 235 | 256 | 204 | 211 |
|   | 26 | 0 | 0 | 0 | 0 | 0 | 0 | 0 | 0 |
| 5 | 0 | 205 | 195 | 83 | 164 | 261 | 219 | 185 | 2 |
|   | 1 | 236 | 14 | 292 | 59 | 181 | 130 | 100 | 171 |
|   | 3 | 194 | 115 | 50 | 86 | 72 | 251 | 24 | 47 |
|   | 12 | 231 | 166 | 318 | 80 | 283 | 322 | 65 | 143 |
|   | 16 | 28 | 241 | 201 | 182 | 254 | 295 | 207 | 210 |
|   | 21 | 123 | 51 | 267 | 130 | 79 | 258 | 161 | 180 |
|   | 22 | 115 | 157 | 279 | 153 | 144 | 283 | 72 | 180 |
|   | 27 | 0 | 0 | 0 | 0 | 0 | 0 | 0 | 0 |
| 6 | 0 | 183 | 278 | 289 | 158 | 80 | 294 | 6 | 199 |
|   | 6 | 22 | 257 | 21 | 119 | 144 | 73 | 27 | 22 |
|   | 10 | 28 | 1 | 293 | 113 | 169 | 330 | 163 | 23 |
|   | 11 | 67 | 351 | 13 | 21 | 90 | 99 | 50 | 100 |
|   | 13 | 244 | 92 | 232 | 63 | 59 | 172 | 48 | 92 |
|   | 17 | 11 | 253 | 302 | 51 | 177 | 150 | 24 | 207 |
|   | 18 | 157 | 18 | 138 | 136 | 151 | 284 | 38 | 52 |
|   | 20 | 211 | 225 | 235 | 116 | 108 | 305 | 91 | 13 |
|   | 28 | 0 | 0 | 0 | 0 | 0 | 0 | 0 | 0 |
| 7 | 0 | 220 | 9 | 12 | 169 | 3 | 145 | 77 |   |
|   | 1 | 44 | 62 | 88 | 76 | 189 | 103 | 88 | 146 |
|   | 4 | 159 | 316 | 207 | 104 | 154 | 224 | 112 | 209 |
|   | 7 | 31 | 333 | 50 | 100 | 184 | 297 | 153 | 32 |
|   | 8 | 167 | 290 | 25 | 150 | 104 | 215 | 159 | 166 |
|   | 14 | 104 | 114 | 76 | 158 | 164 | 39 | 76 | 18 |
|   | 29 | 0 | 0 | 0 | 0 | 0 | 0 | 0 | 0 |
| 8 | 0 | 112 | 307 | 295 | 33 | 54 | 348 | 172 | 181 |
|   | 1 | 4 | 179 | 133 | 95 | 0 | 75 | 2 | 105 |
|   | 3 | 7 | 165 | 130 | 4 | 252 | 22 | 131 | 141 |
|   | 12 | 211 | 18 | 231 | 217 | 41 | 312 | 141 | 223 |
|   | 16 | 102 | 39 | 296 | 204 | 98 | 224 | 96 | 177 |
|   | 19 | 164 | 224 | 110 | 39 | 46 | 17 | 99 | 145 |
|   | 21 | 109 | 368 | 269 | 58 | 15 | 59 | 101 | 199 |
|   | 22 | 241 | 67 | 245 | 44 | 230 | 314 | 35 | 153 |
|   | 24 | 90 | 170 | 151 | 201 | 54 | 244 | 116 | 38 |
|   | 30 | 0 | 0 | 0 | 0 | 0 | 0 | 0 | 0 |
| 9 | 0 | 103 | 366 | 189 | 9 | 162 | 156 | 6 | 169 |
|   | 1 | 182 | 232 | 244 | 37 | 159 | 88 | 10 | 12 |
|   | 10 | 109 | 321 | 36 | 213 | 93 | 293 | 145 | 206 |
|   | 11 | 21 | 133 | 286 | 105 | 134 | 111 | 53 | 221 |
|   | 13 | 142 | 57 | 151 | 89 | 45 | 92 | 201 | 17 |
|   | 17 | 14 | 303 | 267 | 185 | 132 | 152 | 4 | 212 |
|   | 18 | 61 | 63 | 135 | 109 | 76 | 23 | 164 | 92 |
|   | 20 | 216 | 82 | 209 | 218 | 209 | 337 | 173 | 205 |
|   | 31 | 0 | 0 | 0 | 0 | 0 | 0 | 0 | 0 |
| 10 | 1 | 98 | 101 | 14 | 82 | 178 | 175 | 126 | 116 |
|   | 2 | 119 | 339 | 80 | 165 | 1 | 253 | 77 | 151 |
|   | 4 | 167 | 274 | 211 | 174 | 28 | 27 | 156 | 70 |
|   | 7 | 160 | 111 | 75 | 19 | 267 | 231 | 16 | 230 |
|   | 8 | 49 | 383 | 161 | 194 | 234 | 49 | 12 | 115 |
|   | 14 | 58 | 354 | 311 | 103 | 201 | 267 | 70 | 84 |
|   | 32 | 0 | 0 | 0 | 0 | 0 | 0 | 0 | 0 |
| 11 | 0 | 77 | 48 | 16 | 52 | 55 | 25 | 184 | 45 |
|   | 1 | 41 | 102 | 147 | 11 | 23 | 322 | 194 | 115 |
|   | 12 | 83 | 8 | 290 | 2 | 274 | 200 | 123 | 134 |
|   | 16 | 182 | 47 | 289 | 35 | 181 | 351 | 16 | 1 |
|   | 21 | 78 | 188 | 177 | 32 | 273 | 166 | 104 | 152 |
|   | 22 | 252 | 334 | 43 | 84 | 39 | 338 | 109 | 165 |
|   | 23 | 22 | 115 | 280 | 201 | 26 | 192 | 124 | 107 |
|   | 33 | 0 | 0 | 0 | 0 | 0 | 0 | 0 | 0 |
| 12 | 0 | 160 | 77 | 229 | 142 | 225 | 123 | 6 | 186 |
|   | 1 | 42 | 186 | 235 | 175 | 162 | 217 | 20 | 215 |
|   | 10 | 21 | 174 | 169 | 136 | 244 | 142 | 203 | 124 |
|   | 11 | 32 | 232 | 18 | 3 | 151 | 110 | 153 | 180 |
|   | 13 | 234 | 50 | 105 | 28 | 238 | 176 | 101 | 98 |
|   | 18 | 7 | 74 | 52 | 182 | 243 | 76 | 207 | 80 |
|   | 34 | 0 | 0 | 0 | 0 | 0 | 0 | 0 | 0 |
| 13 | 0 | 177 | 313 | 39 | 81 | 231 | 311 | 52 | 220 |
|   | 3 | 248 | 177 | 302 | 56 | 0 | 251 | 147 | 185 |
|   | 7 | 151 | 266 | 303 | 72 | 216 | 265 | 1 | 154 |
|   | 20 | 185 | 115 | 160 | 217 | 47 | 94 | 16 | 178 |
|   | 23 | 62 | 370 | 37 | 78 | 36 | 81 | 46 | 150 |
|   | 35 | 0 | 0 | 0 | 0 | 0 | 0 | 0 | 0 |
| 14 | 0 | 206 | 142 | 78 | 14 | 0 | 22 | 1 | 124 |
|   | 12 | 55 | 248 | 299 | 175 | 186 | 322 | 202 | 144 |
|   | 15 | 206 | 137 | 54 | 211 | 253 | 277 | 118 | 182 |
|   | 16 | 127 | 89 | 61 | 191 | 16 | 156 | 130 | 95 |
|   | 17 | 16 | 347 | 179 | 51 | 0 | 66 | 1 | 72 |
|   | 21 | 229 | 12 | 258 | 43 | 79 | 78 | 2 | 76 |
|   | 36 | 0 | 0 | 0 | 0 | 0 | 0 | 0 | 0 |
| 15 | 0 | 40 | 241 | 229 | 90 | 170 | 176 | 173 | 39 |
|   | 1 | 96 | 2 | 290 | 120 | 0 | 348 | 6 | 138 |
|   | 10 | 65 | 210 | 60 | 131 | 183 | 15 | 81 | 220 |
|   | 13 | 63 | 318 | 130 | 209 | 108 | 81 | 182 | 173 |
|   | 18 | 75 | 55 | 184 | 209 | 68 | 176 | 53 | 142 |
|   | 25 | 179 | 269 | 51 | 81 | 64 | 113 | 46 | 49 |
|   | 37 | 0 | 0 | 0 | 0 | 0 | 0 | 0 | 0 |
| 16 | 1 | 64 | 13 | 69 | 154 | 270 | 190 | 88 | 78 |
|   | 3 | 49 | 338 | 140 | 161 | 13 | 293 | 198 | 152 |
|   | 11 | 49 | 57 | 45 | 43 | 99 | 332 | 160 | 84 |
|   | 20 | 51 | 289 | 115 | 189 | 54 | 331 | 122 | 5 |
|   | 22 | 154 | 57 | 300 | 101 | 0 | 114 | 182 | 205 |
|   | 38 | 0 | 0 | 0 | 0 | 0 | 0 | 0 | 0 |
| 17 | 0 | 7 | 260 | 257 | 56 | 153 | 110 | 91 | 183 |
|   | 14 | 164 | 303 | 147 | 110 | 137 | 228 | 184 | 112 |
|   | 16 | 59 | 81 | 128 | 200 | 0 | 247 | 30 | 106 |
|   | 17 | 1 | 358 | 51 | 63 | 0 | 116 | 3 | 219 |
|   | 21 | 144 | 375 | 228 | 4 | 162 | 190 | 155 | 129 |
|   | 39 | 0 | 0 | 0 | 0 | 0 | 0 | 0 | 0 |

TABLE 2-continued

Shift values for BG1

| i | j | $i_{LS}$ 0 | 1 | 2 | 3 | 4 | 5 | 6 | 7 |
|---|---|---|---|---|---|---|---|---|---|
| 18 | 1 | 42 | 130 | 260 | 199 | 161 | 47 | 1 | 183 |
|  | 12 | 233 | 163 | 294 | 110 | 151 | 286 | 41 | 215 |
|  | 13 | 8 | 280 | 291 | 200 | 0 | 246 | 167 | 180 |
|  | 18 | 155 | 132 | 141 | 143 | 241 | 181 | 68 | 143 |
|  | 19 | 147 | 4 | 295 | 186 | 144 | 73 | 148 | 14 |
|  | 40 | 0 | 0 | 0 | 0 | 0 | 0 | 0 | 0 |
| 19 | 0 | 60 | 145 | 64 | 8 | 0 | 87 | 12 | 179 |
|  | 1 | 73 | 213 | 181 | 6 | 0 | 110 | 6 | 108 |
|  | 7 | 72 | 314 | 101 | 103 | 118 | 147 | 166 | 159 |
|  | 8 | 127 | 242 | 270 | 198 | 144 | 258 | 184 | 138 |
|  | 10 | 224 | 197 | 11 | 8 | 0 | 204 | 191 | 196 |
|  | 41 | 0 | 0 | 0 | 0 | 0 | 0 | 0 | 0 |
| 20 | 0 | 151 | 187 | 301 | 105 | 265 | 89 | 6 | 77 |
|  | 3 | 186 | 206 | 162 | 210 | 81 | 65 | 12 | 187 |
|  | 9 | 217 | 264 | 40 | 121 | 90 | 155 | 15 | 203 |
|  | 11 | 47 | 341 | 130 | 214 | 144 | 244 | 5 | 167 |
|  | 22 | 160 | 59 | 10 | 183 | 228 | 30 | 30 | 130 |
|  | 42 | 0 | 0 | 0 | 0 | 0 | 0 | 0 | 0 |
| 21 | 1 | 249 | 205 | 79 | 192 | 64 | 162 | 6 | 197 |
|  | 5 | 121 | 102 | 175 | 131 | 46 | 264 | 86 | 122 |
|  | 16 | 109 | 328 | 132 | 220 | 266 | 346 | 96 | 215 |
|  | 20 | 131 | 213 | 283 | 50 | 9 | 143 | 42 | 65 |
|  | 21 | 171 | 97 | 103 | 106 | 18 | 109 | 199 | 216 |
|  | 43 | 0 | 0 | 0 | 0 | 0 | 0 | 0 | 0 |
| 22 | 0 | 61 | 30 | 177 | 53 | 72 | 280 | 44 | 25 |
|  | 12 | 142 | 11 | 20 | 0 | 189 | 157 | 58 | 47 |
|  | 13 | 188 | 233 | 55 | 3 | 72 | 236 | 130 | 126 |
|  | 17 | 158 | 22 | 316 | 148 | 257 | 113 | 131 | 178 |
|  | 44 | 0 | 0 | 0 | 0 | 0 | 0 | 0 | 0 |
| 23 | 1 | 156 | 24 | 249 | 88 | 180 | 18 | 45 | 185 |
|  | 2 | 147 | 89 | 50 | 203 | 0 | 6 | 18 | 127 |
|  | 10 | 170 | 61 | 133 | 168 | 0 | 181 | 132 | 117 |
|  | 18 | 152 | 27 | 105 | 122 | 165 | 304 | 100 | 199 |
|  | 45 | 0 | 0 | 0 | 0 | 0 | 0 | 0 | 0 |
| 24 | 0 | 112 | 298 | 289 | 49 | 236 | 38 | 9 | 32 |
|  | 3 | 86 | 158 | 280 | 157 | 199 | 170 | 125 | 178 |
|  | 4 | 236 | 235 | 110 | 64 | 0 | 249 | 191 | 2 |
|  | 11 | 116 | 339 | 187 | 193 | 266 | 288 | 28 | 156 |
|  | 22 | 222 | 234 | 281 | 124 | 0 | 194 | 6 | 58 |
|  | 46 | 0 | 0 | 0 | 0 | 0 | 0 | 0 | 0 |
| 25 | 1 | 23 | 72 | 172 | 1 | 205 | 279 | 4 | 27 |
|  | 6 | 136 | 17 | 295 | 166 | 0 | 255 | 74 | 141 |
|  | 7 | 116 | 383 | 96 | 65 | 0 | 111 | 16 | 11 |
|  | 14 | 182 | 312 | 46 | 81 | 183 | 54 | 28 | 181 |
|  | 47 | 0 | 0 | 0 | 0 | 0 | 0 | 0 | 0 |
| 26 | 0 | 195 | 71 | 270 | 107 | 0 | 325 | 21 | 163 |
|  | 2 | 243 | 81 | 110 | 176 | 0 | 326 | 142 | 131 |
|  | 4 | 215 | 76 | 318 | 212 | 0 | 226 | 192 | 169 |
|  | 15 | 61 | 136 | 67 | 127 | 277 | 99 | 197 | 98 |
|  | 48 | 0 | 0 | 0 | 0 | 0 | 0 | 0 | 0 |
| 27 | 1 | 25 | 194 | 210 | 208 | 45 | 91 | 98 | 165 |
|  | 6 | 104 | 194 | 29 | 141 | 36 | 326 | 140 | 232 |
|  | 8 | 194 | 101 | 304 | 174 | 72 | 268 | 22 | 9 |
|  | 49 | 0 | 0 | 0 | 0 | 0 | 0 | 0 | 0 |
| 28 | 0 | 128 | 222 | 11 | 146 | 275 | 102 | 4 | 32 |
|  | 4 | 165 | 19 | 293 | 153 | 0 | 1 | 1 | 43 |
|  | 19 | 181 | 244 | 50 | 217 | 155 | 40 | 40 | 200 |
|  | 21 | 63 | 274 | 234 | 114 | 62 | 167 | 93 | 205 |
|  | 50 | 0 | 0 | 0 | 0 | 0 | 0 | 0 | 0 |
| 29 | 1 | 86 | 252 | 27 | 150 | 0 | 273 | 92 | 232 |
|  | 14 | 236 | 5 | 308 | 11 | 180 | 104 | 136 | 32 |
|  | 18 | 84 | 147 | 117 | 53 | 0 | 243 | 106 | 118 |
|  | 25 | 6 | 78 | 29 | 68 | 42 | 107 | 6 | 103 |
|  | 51 | 0 | 0 | 0 | 0 | 0 | 0 | 0 | 0 |
| 30 | 0 | 216 | 159 | 91 | 34 | 0 | 171 | 2 | 170 |
|  | 10 | 73 | 229 | 23 | 130 | 90 | 16 | 88 | 199 |
|  | 13 | 120 | 260 | 105 | 210 | 252 | 95 | 112 | 26 |
|  | 24 | 9 | 90 | 135 | 123 | 173 | 212 | 20 | 105 |
|  | 52 | 0 | 0 | 0 | 0 | 0 | 0 | 0 | 0 |
| 31 | 1 | 95 | 100 | 222 | 175 | 144 | 101 | 4 | 73 |
|  | 7 | 177 | 215 | 308 | 49 | 144 | 297 | 49 | 149 |
|  | 22 | 172 | 258 | 66 | 177 | 166 | 279 | 125 | 175 |
|  | 25 | 61 | 256 | 162 | 128 | 19 | 222 | 194 | 108 |
|  | 53 | 0 | 0 | 0 | 0 | 0 | 0 | 0 | 0 |
| 32 | 0 | 221 | 102 | 210 | 192 | 0 | 351 | 6 | 103 |
|  | 12 | 112 | 201 | 22 | 209 | 211 | 265 | 126 | 110 |
|  | 14 | 199 | 175 | 271 | 58 | 36 | 338 | 63 | 151 |
|  | 24 | 121 | 287 | 217 | 30 | 162 | 83 | 20 | 211 |
|  | 54 | 0 | 0 | 0 | 0 | 0 | 0 | 0 | 0 |
| 33 | 1 | 2 | 323 | 170 | 114 | 0 | 56 | 10 | 199 |
|  | 2 | 187 | 8 | 20 | 49 | 0 | 304 | 30 | 132 |
|  | 11 | 41 | 361 | 140 | 161 | 76 | 141 | 6 | 172 |
|  | 21 | 211 | 105 | 33 | 137 | 18 | 101 | 92 | 65 |
|  | 55 | 0 | 0 | 0 | 0 | 0 | 0 | 0 | 0 |
| 34 | 0 | 127 | 230 | 187 | 82 | 197 | 60 | 4 | 161 |
|  | 7 | 167 | 148 | 296 | 186 | 0 | 320 | 153 | 237 |
|  | 15 | 164 | 202 | 5 | 68 | 108 | 112 | 197 | 142 |
|  | 17 | 159 | 312 | 44 | 150 | 0 | 54 | 155 | 180 |
|  | 56 | 0 | 0 | 0 | 0 | 0 | 0 | 0 | 0 |
| 35 | 1 | 161 | 320 | 207 | 192 | 199 | 100 | 4 | 231 |
|  | 6 | 197 | 335 | 158 | 173 | 278 | 210 | 45 | 174 |
|  | 12 | 207 | 2 | 55 | 26 | 0 | 195 | 168 | 145 |
|  | 22 | 103 | 266 | 285 | 187 | 205 | 268 | 185 | 100 |
|  | 57 | 0 | 0 | 0 | 0 | 0 | 0 | 0 | 0 |
| 36 | 0 | 37 | 210 | 259 | 222 | 216 | 135 | 6 | 11 |
|  | 14 | 105 | 313 | 179 | 157 | 16 | 15 | 200 | 207 |
|  | 15 | 51 | 297 | 178 | 0 | 0 | 35 | 177 | 42 |
|  | 18 | 120 | 21 | 160 | 6 | 0 | 188 | 43 | 100 |
|  | 58 | 0 | 0 | 0 | 0 | 0 | 0 | 0 | 0 |
| 37 | 1 | 198 | 269 | 298 | 81 | 72 | 319 | 82 | 59 |
|  | 13 | 220 | 82 | 15 | 195 | 144 | 236 | 2 | 204 |
|  | 23 | 122 | 115 | 115 | 138 | 0 | 85 | 135 | 161 |
|  | 59 | 0 | 0 | 0 | 0 | 0 | 0 | 0 | 0 |
| 38 | 0 | 167 | 185 | 151 | 123 | 190 | 164 | 91 | 121 |
|  | 9 | 151 | 177 | 179 | 90 | 0 | 196 | 64 | 90 |
|  | 10 | 157 | 289 | 64 | 73 | 0 | 209 | 198 | 26 |
|  | 12 | 163 | 214 | 181 | 10 | 0 | 246 | 100 | 140 |
|  | 60 | 0 | 0 | 0 | 0 | 0 | 0 | 0 | 0 |
| 39 | 1 | 173 | 258 | 102 | 12 | 153 | 236 | 4 | 115 |
|  | 3 | 139 | 93 | 77 | 77 | 0 | 264 | 28 | 188 |
|  | 7 | 149 | 346 | 192 | 49 | 165 | 37 | 109 | 168 |
|  | 19 | 0 | 297 | 208 | 114 | 117 | 272 | 188 | 52 |
|  | 61 | 0 | 0 | 0 | 0 | 0 | 0 | 0 | 0 |
| 40 | 0 | 157 | 175 | 32 | 67 | 216 | 304 | 10 | 4 |
|  | 8 | 137 | 37 | 80 | 45 | 144 | 237 | 84 | 103 |
|  | 17 | 149 | 312 | 197 | 96 | 2 | 135 | 12 | 30 |
|  | 62 | 0 | 0 | 0 | 0 | 0 | 0 | 0 | 0 |
| 41 | 1 | 167 | 52 | 154 | 23 | 0 | 123 | 2 | 53 |
|  | 3 | 173 | 314 | 47 | 215 | 0 | 77 | 75 | 189 |
|  | 9 | 139 | 139 | 124 | 60 | 0 | 25 | 142 | 215 |
|  | 18 | 151 | 288 | 207 | 167 | 183 | 272 | 128 | 24 |
|  | 63 | 0 | 0 | 0 | 0 | 0 | 0 | 0 | 0 |
| 42 | 0 | 149 | 113 | 226 | 114 | 27 | 288 | 163 | 222 |
|  | 4 | 157 | 14 | 65 | 91 | 0 | 83 | 10 | 170 |
|  | 24 | 137 | 218 | 126 | 78 | 35 | 17 | 162 | 71 |
|  | 64 | 0 | 0 | 0 | 0 | 0 | 0 | 0 | 0 |
| 43 | 1 | 151 | 113 | 228 | 206 | 52 | 210 | 1 | 22 |
|  | 16 | 163 | 132 | 69 | 22 | 243 | 3 | 163 | 127 |
|  | 18 | 173 | 114 | 176 | 134 | 0 | 53 | 99 | 49 |
|  | 25 | 139 | 168 | 102 | 161 | 270 | 167 | 98 | 125 |
|  | 65 | 0 | 0 | 0 | 0 | 0 | 0 | 0 | 0 |
| 44 | 0 | 139 | 80 | 234 | 84 | 18 | 79 | 4 | 191 |
|  | 7 | 157 | 78 | 227 | 4 | 0 | 244 | 6 | 211 |
|  | 9 | 163 | 163 | 259 | 9 | 0 | 293 | 142 | 187 |
|  | 22 | 173 | 274 | 260 | 12 | 57 | 272 | 3 | 148 |
|  | 66 | 0 | 0 | 0 | 0 | 0 | 0 | 0 | 0 |
| 45 | 1 | 149 | 135 | 101 | 181 | 168 | 82 | 181 | 177 |
|  | 6 | 151 | 149 | 228 | 121 | 0 | 67 | 45 | 114 |
|  | 10 | 167 | 15 | 126 | 29 | 144 | 235 | 153 | 93 |
|  | 67 | 0 | 0 | 0 | 0 | 0 | 0 | 0 | 0 |

TABLE 3

Shift values for BG2

| i | j | $i_{LS}$ 0 | 1 | 2 | 3 | 4 | 5 | 6 | 7 |
|---|---|---|---|---|---|---|---|---|---|
| 0 | 0 | 9 | 174 | 0 | 72 | 3 | 156 | 143 | 145 |
|   | 1 | 117 | 97 | 0 | 110 | 26 | 143 | 19 | 131 |
|   | 2 | 204 | 166 | 0 | 23 | 53 | 14 | 176 | 71 |
|   | 3 | 26 | 66 | 0 | 181 | 35 | 3 | 165 | 21 |
|   | 6 | 189 | 71 | 0 | 95 | 115 | 40 | 196 | 23 |
|   | 9 | 205 | 172 | 0 | 8 | 127 | 123 | 13 | 112 |
|   | 10 | 0 | 0 | 0 | 1 | 0 | 0 | 0 | 1 |
|   | 11 | 0 | 0 | 0 | 0 | 0 | 0 | 0 | 0 |
| 1 | 0 | 167 | 27 | 137 | 53 | 19 | 17 | 18 | 112 |
|   | 3 | 166 | 36 | 124 | 156 | 94 | 65 | 27 | 174 |
|   | 4 | 253 | 48 | 0 | 115 | 101 | 63 | 3 | 183 |
|   | 5 | 125 | 92 | 0 | 156 | 66 | 1 | 102 | 27 |
|   | 6 | 226 | 31 | 88 | 115 | 84 | 55 | 185 | 96 |
|   | 7 | 156 | 187 | 0 | 200 | 98 | 37 | 17 | 23 |
|   | 8 | 224 | 185 | 0 | 29 | 69 | 171 | 14 | 9 |
|   | 9 | 252 | 3 | 55 | 31 | 50 | 133 | 180 | 167 |
|   | 11 | 0 | 0 | 0 | 0 | 0 | 0 | 0 | 0 |
|   | 12 | 0 | 0 | 0 | 0 | 0 | 0 | 0 | 0 |
| 2 | 0 | 81 | 25 | 20 | 152 | 95 | 98 | 126 | 74 |
|   | 1 | 114 | 114 | 94 | 131 | 106 | 168 | 163 | 31 |
|   | 3 | 44 | 117 | 99 | 46 | 92 | 107 | 47 | 3 |
|   | 4 | 52 | 110 | 9 | 191 | 110 | 82 | 183 | 53 |
|   | 8 | 240 | 114 | 108 | 91 | 111 | 142 | 132 | 155 |
|   | 10 | 1 | 1 | 1 | 0 | 1 | 1 | 1 | 0 |
|   | 12 | 0 | 0 | 0 | 0 | 0 | 0 | 0 | 0 |
|   | 13 | 0 | 0 | 0 | 0 | 0 | 0 | 0 | 0 |
| 3 | 1 | 8 | 136 | 38 | 185 | 120 | 53 | 36 | 239 |
|   | 2 | 58 | 175 | 15 | 6 | 121 | 174 | 48 | 171 |
|   | 4 | 158 | 113 | 102 | 36 | 22 | 171 | 18 | 95 |
|   | 5 | 104 | 72 | 146 | 124 | 4 | 127 | 111 | 110 |
|   | 6 | 209 | 123 | 12 | 124 | 73 | 17 | 203 | 159 |
|   | 7 | 54 | 118 | 57 | 110 | 49 | 89 | 3 | 199 |
|   | 8 | 18 | 28 | 53 | 156 | 128 | 17 | 191 | 43 |
|   | 9 | 128 | 186 | 46 | 133 | 79 | 105 | 160 | 75 |
|   | 10 | 0 | 0 | 0 | 1 | 0 | 0 | 0 | 1 |
|   | 13 | 0 | 0 | 0 | 0 | 0 | 0 | 0 | 0 |
| 4 | 0 | 179 | 72 | 0 | 200 | 42 | 86 | 43 | 29 |
|   | 1 | 214 | 74 | 136 | 16 | 24 | 67 | 27 | 140 |
|   | 11 | 71 | 29 | 157 | 101 | 51 | 83 | 117 | 180 |
|   | 14 | 0 | 0 | 0 | 0 | 0 | 0 | 0 | 0 |
| 5 | 0 | 231 | 10 | 0 | 185 | 40 | 79 | 136 | 121 |
|   | 1 | 41 | 44 | 131 | 138 | 140 | 84 | 49 | 41 |
|   | 5 | 194 | 121 | 142 | 170 | 84 | 35 | 36 | 169 |
|   | 7 | 159 | 80 | 141 | 219 | 137 | 103 | 132 | 88 |
|   | 11 | 103 | 48 | 64 | 193 | 71 | 60 | 62 | 207 |
|   | 15 | 0 | 0 | 0 | 0 | 0 | 0 | 0 | 0 |
| 6 | 0 | 155 | 129 | 0 | 123 | 109 | 47 | 7 | 137 |
|   | 5 | 228 | 92 | 124 | 55 | 87 | 154 | 34 | 72 |
|   | 7 | 45 | 100 | 99 | 31 | 107 | 10 | 198 | 172 |
|   | 9 | 28 | 49 | 45 | 222 | 133 | 155 | 168 | 124 |
|   | 11 | 158 | 184 | 148 | 209 | 139 | 29 | 12 | 56 |
|   | 16 | 0 | 0 | 0 | 0 | 0 | 0 | 0 | 0 |
| 7 | 1 | 129 | 80 | 0 | 103 | 97 | 48 | 163 | 86 |
|   | 5 | 147 | 186 | 45 | 13 | 135 | 125 | 78 | 186 |
|   | 7 | 140 | 16 | 148 | 105 | 35 | 24 | 143 | 87 |
|   | 11 | 3 | 102 | 96 | 150 | 108 | 47 | 107 | 172 |
|   | 13 | 116 | 143 | 78 | 181 | 65 | 55 | 58 | 154 |
|   | 17 | 0 | 0 | 0 | 0 | 0 | 0 | 0 | 0 |
| 8 | 0 | 142 | 118 | 0 | 147 | 70 | 53 | 101 | 176 |
|   | 1 | 94 | 70 | 65 | 43 | 69 | 31 | 177 | 169 |
|   | 12 | 230 | 152 | 87 | 152 | 88 | 161 | 22 | 225 |
|   | 18 | 0 | 0 | 0 | 0 | 0 | 0 | 0 | 0 |
| 9 | 1 | 203 | 28 | 0 | 2 | 97 | 104 | 186 | 167 |
|   | 8 | 205 | 132 | 97 | 30 | 40 | 142 | 27 | 238 |
|   | 10 | 61 | 185 | 51 | 184 | 24 | 99 | 205 | 48 |
|   | 11 | 247 | 178 | 85 | 83 | 49 | 64 | 81 | 68 |
|   | 19 | 0 | 0 | 0 | 0 | 0 | 0 | 0 | 0 |
| 10 | 0 | 11 | 59 | 0 | 174 | 46 | 111 | 125 | 38 |
|   | 1 | 185 | 104 | 17 | 150 | 41 | 25 | 60 | 217 |
|   | 6 | 0 | 22 | 156 | 8 | 101 | 174 | 177 | 208 |
|   | 7 | 117 | 52 | 20 | 56 | 96 | 23 | 51 | 232 |
|   | 20 | 0 | 0 | 0 | 0 | 0 | 0 | 0 | 0 |
| 11 | 0 | 11 | 32 | 0 | 99 | 28 | 91 | 39 | 178 |
|   | 7 | 236 | 92 | 7 | 138 | 30 | 175 | 29 | 214 |
|   | 9 | 210 | 174 | 4 | 110 | 116 | 24 | 35 | 168 |
|   | 13 | 56 | 154 | 2 | 99 | 61 | 141 | 8 | 51 |
|   | 21 | 0 | 0 | 0 | 0 | 0 | 0 | 0 | 0 |
| 12 | 1 | 63 | 39 | 0 | 46 | 33 | 122 | 18 | 124 |
|   | 3 | 111 | 93 | 113 | 217 | 122 | 11 | 155 | 122 |
|   | 11 | 14 | 11 | 48 | 109 | 131 | 4 | 19 | 72 |
|   | 22 | 0 | 0 | 0 | 0 | 0 | 0 | 0 | 0 |
| 13 | 0 | 83 | 49 | 0 | 37 | 76 | 29 | 32 | 48 |
|   | 1 | 2 | 125 | 112 | 113 | 37 | 91 | 53 | 57 |
|   | 8 | 38 | 35 | 102 | 143 | 62 | 27 | 95 | 167 |
|   | 13 | 222 | 166 | 26 | 140 | 47 | 127 | 186 | 219 |
|   | 23 | 0 | 0 | 0 | 0 | 0 | 0 | 0 | 0 |
| 14 | 1 | 115 | 19 | 0 | 36 | 143 | 11 | 91 | 82 |
|   | 6 | 145 | 118 | 138 | 95 | 51 | 145 | 20 | 232 |
|   | 11 | 3 | 21 | 57 | 40 | 130 | 8 | 52 | 204 |
|   | 13 | 232 | 163 | 27 | 116 | 97 | 166 | 109 | 162 |
|   | 24 | 0 | 0 | 0 | 0 | 0 | 0 | 0 | 0 |
| 15 | 0 | 51 | 68 | 0 | 116 | 139 | 137 | 174 | 38 |
|   | 10 | 175 | 63 | 73 | 200 | 96 | 103 | 108 | 217 |
|   | 11 | 213 | 81 | 99 | 110 | 128 | 40 | 102 | 157 |
|   | 25 | 0 | 0 | 0 | 0 | 0 | 0 | 0 | 0 |
| 16 | 1 | 203 | 87 | 0 | 75 | 48 | 78 | 125 | 170 |
|   | 9 | 142 | 177 | 79 | 158 | 9 | 158 | 31 | 23 |
|   | 11 | 8 | 135 | 111 | 134 | 28 | 17 | 54 | 175 |
|   | 12 | 242 | 64 | 143 | 97 | 8 | 165 | 176 | 202 |
|   | 26 | 0 | 0 | 0 | 0 | 0 | 0 | 0 | 0 |
| 17 | 1 | 254 | 158 | 0 | 48 | 120 | 134 | 57 | 196 |
|   | 5 | 124 | 23 | 24 | 132 | 43 | 23 | 201 | 173 |
|   | 11 | 114 | 9 | 109 | 206 | 65 | 62 | 142 | 195 |
|   | 12 | 64 | 6 | 18 | 2 | 42 | 163 | 35 | 218 |
|   | 27 | 0 | 0 | 0 | 0 | 0 | 0 | 0 | 0 |
| 18 | 0 | 220 | 186 | 0 | 68 | 17 | 173 | 129 | 128 |
|   | 6 | 194 | 6 | 18 | 16 | 106 | 31 | 203 | 211 |
|   | 7 | 50 | 46 | 86 | 156 | 142 | 22 | 140 | 210 |
|   | 28 | 0 | 0 | 0 | 0 | 0 | 0 | 0 | 0 |
| 19 | 0 | 87 | 58 | 0 | 35 | 79 | 13 | 110 | 39 |
|   | 1 | 20 | 42 | 158 | 138 | 28 | 135 | 124 | 84 |
|   | 10 | 185 | 156 | 154 | 86 | 41 | 145 | 52 | 88 |
|   | 29 | 0 | 0 | 0 | 0 | 0 | 0 | 0 | 0 |
| 20 | 1 | 26 | 76 | 0 | 6 | 2 | 128 | 196 | 117 |
|   | 4 | 105 | 61 | 148 | 20 | 103 | 52 | 35 | 227 |
|   | 11 | 29 | 153 | 104 | 141 | 78 | 173 | 114 | 6 |
|   | 30 | 0 | 0 | 0 | 0 | 0 | 0 | 0 | 0 |
| 21 | 0 | 76 | 157 | 0 | 80 | 91 | 156 | 10 | 238 |
|   | 8 | 42 | 175 | 17 | 43 | 75 | 166 | 122 | 13 |
|   | 13 | 210 | 67 | 33 | 81 | 81 | 40 | 23 | 11 |
|   | 31 | 0 | 0 | 0 | 0 | 0 | 0 | 0 | 0 |
| 22 | 1 | 222 | 20 | 0 | 49 | 54 | 18 | 202 | 195 |
|   | 2 | 63 | 52 | 4 | 1 | 132 | 163 | 126 | 44 |
|   | 32 | 0 | 0 | 0 | 0 | 0 | 0 | 0 | 0 |
| 23 | 0 | 23 | 106 | 0 | 156 | 68 | 110 | 52 | 5 |
|   | 3 | 235 | 86 | 75 | 54 | 115 | 132 | 170 | 94 |
|   | 5 | 238 | 95 | 158 | 134 | 56 | 150 | 13 | 111 |
|   | 33 | 0 | 0 | 0 | 0 | 0 | 0 | 0 | 0 |
| 24 | 1 | 46 | 182 | 0 | 153 | 30 | 113 | 113 | 81 |
|   | 2 | 139 | 153 | 69 | 88 | 42 | 108 | 161 | 19 |
|   | 9 | 8 | 64 | 87 | 63 | 101 | 61 | 88 | 130 |
|   | 34 | 0 | 0 | 0 | 0 | 0 | 0 | 0 | 0 |
| 25 | 0 | 228 | 45 | 0 | 211 | 128 | 72 | 197 | 66 |
|   | 5 | 156 | 21 | 65 | 94 | 63 | 136 | 194 | 95 |
|   | 35 | 0 | 0 | 0 | 0 | 0 | 0 | 0 | 0 |
| 26 | 2 | 29 | 67 | 0 | 90 | 142 | 36 | 164 | 146 |
|   | 7 | 143 | 137 | 100 | 6 | 28 | 38 | 172 | 66 |
|   | 12 | 160 | 55 | 13 | 221 | 100 | 53 | 49 | 190 |
|   | 13 | 122 | 85 | 7 | 6 | 133 | 145 | 161 | 86 |
|   | 36 | 0 | 0 | 0 | 0 | 0 | 0 | 0 | 0 |
| 27 | 0 | 8 | 103 | 0 | 27 | 13 | 42 | 168 | 64 |
|   | 6 | 151 | 50 | 32 | 118 | 10 | 104 | 193 | 181 |
|   | 37 | 0 | 0 | 0 | 0 | 0 | 0 | 0 | 0 |

TABLE 3-continued

Shift values for BG2

| i | j | $i_{LS}$ | | | | | | | |
|---|---|---|---|---|---|---|---|---|---|
|   |   | 0 | 1 | 2 | 3 | 4 | 5 | 6 | 7 |
| 28 | 1 | 98 | 70 | 0 | 216 | 106 | 64 | 14 | 7 |
|   | 2 | 101 | 111 | 126 | 212 | 77 | 24 | 186 | 114 |
|   | 5 | 135 | 168 | 110 | 193 | 43 | 149 | 46 | 16 |
|   | 38 | 0 | 0 | 0 | 0 | 0 | 0 | 0 | 0 |
| 29 | 0 | 18 | 110 | 0 | 108 | 133 | 139 | 50 | 25 |
|   | 4 | 28 | 17 | 154 | 61 | 25 | 161 | 27 | 57 |
|   | 39 | 0 | 0 | 0 | 0 | 0 | 0 | 0 | 0 |
| 30 | 2 | 71 | 120 | 0 | 106 | 87 | 84 | 70 | 37 |
|   | 5 | 240 | 154 | 35 | 44 | 56 | 173 | 17 | 139 |
|   | 7 | 9 | 52 | 51 | 185 | 104 | 93 | 50 | 221 |
|   | 9 | 84 | 56 | 134 | 176 | 70 | 29 | 6 | 17 |
|   | 40 | 0 | 0 | 0 | 0 | 0 | 0 | 0 | 0 |
| 31 | 1 | 106 | 3 | 0 | 147 | 80 | 117 | 115 | 201 |
|   | 13 | 1 | 170 | 20 | 182 | 139 | 148 | 189 | 46 |
|   | 41 | 0 | 0 | 0 | 0 | 0 | 0 | 0 | 0 |
| 32 | 0 | 242 | 84 | 0 | 108 | 32 | 116 | 110 | 179 |
|   | 5 | 44 | 8 | 20 | 21 | 89 | 73 | 0 | 14 |
|   | 12 | 166 | 17 | 122 | 110 | 71 | 142 | 163 | 116 |
|   | 42 | 0 | 0 | 0 | 0 | 0 | 0 | 0 | 0 |
| 33 | 2 | 132 | 165 | 0 | 71 | 135 | 105 | 163 | 46 |
|   | 7 | 164 | 179 | 88 | 12 | 6 | 137 | 173 | 2 |
|   | 10 | 235 | 124 | 13 | 109 | 2 | 29 | 179 | 106 |
|   | 43 | 0 | 0 | 0 | 0 | 0 | 0 | 0 | 0 |
| 34 | 0 | 147 | 173 | 0 | 29 | 37 | 11 | 197 | 184 |
|   | 12 | 85 | 177 | 19 | 201 | 25 | 41 | 191 | 135 |
|   | 13 | 36 | 12 | 78 | 69 | 114 | 162 | 193 | 141 |
|   | 44 | 0 | 0 | 0 | 0 | 0 | 0 | 0 | 0 |
| 35 | 1 | 57 | 77 | 0 | 91 | 60 | 126 | 157 | 85 |
|   | 5 | 40 | 184 | 157 | 165 | 137 | 152 | 167 | 225 |
|   | 11 | 63 | 18 | 6 | 55 | 93 | 172 | 181 | 175 |
|   | 45 | 0 | 0 | 0 | 0 | 0 | 0 | 0 | 0 |
| 36 | 0 | 140 | 25 | 0 | 1 | 121 | 73 | 197 | 178 |
|   | 2 | 38 | 151 | 63 | 175 | 129 | 154 | 167 | 112 |
|   | 7 | 154 | 170 | 82 | 83 | 26 | 129 | 179 | 106 |
|   | 46 | 0 | 0 | 0 | 0 | 0 | 0 | 0 | 0 |
| 37 | 10 | 219 | 37 | 0 | 40 | 97 | 167 | 181 | 154 |
|   | 13 | 151 | 31 | 144 | 12 | 56 | 38 | 193 | 114 |
|   | 47 | 0 | 0 | 0 | 0 | 0 | 0 | 0 | 0 |
| 38 | 1 | 31 | 84 | 0 | 37 | 1 | 112 | 157 | 42 |
|   | 5 | 66 | 151 | 93 | 97 | 70 | 7 | 173 | 41 |
|   | 11 | 38 | 190 | 19 | 46 | 1 | 19 | 191 | 105 |
|   | 48 | 0 | 0 | 0 | 0 | 0 | 0 | 0 | 0 |
| 39 | 0 | 239 | 93 | 0 | 106 | 119 | 109 | 181 | 167 |
|   | 7 | 172 | 132 | 24 | 181 | 32 | 6 | 157 | 45 |
|   | 12 | 34 | 57 | 138 | 154 | 142 | 105 | 173 | 189 |
|   | 49 | 0 | 0 | 0 | 0 | 0 | 0 | 0 | 0 |
| 40 | 2 | 0 | 103 | 0 | 98 | 6 | 160 | 193 | 78 |
|   | 10 | 75 | 107 | 36 | 35 | 73 | 156 | 163 | 67 |
|   | 13 | 120 | 163 | 143 | 36 | 102 | 82 | 179 | 180 |
|   | 50 | 0 | 0 | 0 | 0 | 0 | 0 | 0 | 0 |
| 41 | 1 | 129 | 147 | 0 | 120 | 18 | 132 | 191 | 53 |
|   | 5 | 229 | 7 | 2 | 101 | 47 | 6 | 197 | 215 |
|   | 11 | 118 | 60 | 55 | 81 | 19 | 8 | 167 | 230 |
|   | 51 | 0 | 0 | 0 | 0 | 0 | 0 | 0 | 0 |

TABLE 4

All the lifting sizes supported by BG1 and BG2 of the base graph matrices

| Set index ($i_{LS}$) | Set of lifting sizes |
|---|---|
| 0 | {2, 4, 8, 16, 32, 64, 128, 256} |
| 1 | {3, 6, 12, 24, 48, 96, 192, 384} |
| 2 | {5, 10, 20, 40, 80, 160, 320} |
| 3 | {7, 14, 28, 56, 112, 224} |
| 4 | {9, 18, 36, 72, 144, 288} |
| 5 | {11, 22, 44, 88, 176, 352} |
| 6 | {13, 26, 52, 104, 208} |
| 7 | {15, 30, 60, 120, 240} |

In one embodiment, there is a redundancy version set {RV0, RV1, RV2, RV3}, wherein the redundancy version is an element of the redundancy version set. The starting bit index of the to-be-transmitted bit sequence, corresponding to the i-th redundancy version RVi of the redundancy version set, is: Ai×Z, i=0, 1, 2, or 3, and Z is the lifting size. In one embodiment, for the bit selection corresponding to the redundancy version RV0, the starting bit index is 0, i.e., A0=0.

In one embodiment, in the redundant version set, for the bit selection corresponding to the redundancy version RV1, the starting bit index is A1×Z, wherein A1 is equal to kb0−1, kb0, kb0+1, kb0+2, Kb0+3, kb0+4, or kb0+5, where kb0 is the number of system columns of the base matrix. In one embodiment, the base graph matrix of the base matrix may be BG1 and kb0=22; and the base graph matrix of the base matrix may be BG2 and kb0=10.

In one embodiment, there is a code rate threshold R max, such that in the redundant version set, for the bit selection corresponding to the redundancy version RV1, the starting bit index is A1×Z, wherein A1 is determined by the code rate threshold R max. R max may be a real number greater than 0.4 and less than 1. In one embodiment, in one embodiment, the A1 is equal to function($\alpha \times$kb/R max)+2+$\delta$, wherein kb is a positive integer less than or equal to the number of system columns of the base matrix, $\alpha$ is a real number greater than 0, $\delta$ is an integer greater than −10 and less than 10, function(•) means taking a closest upper integer, taking a closest lower integer, or taking an integer by rounding. In one embodiment, in a specific embodiment, the base graph matrix of the base matrix is BG1, and the code rate threshold R max is a real number greater than or equal to 8/9 and less than 1; or the base graph matrix of the base matrix is BG2, and the code rate threshold R max is a real number greater than or equal to ⅔ and less than 1.

In one embodiment, in the redundancy version set, for the bit selections corresponding to the redundancy versions RV2 and RV3, the starting bit indices are A2×Z and A3×Z, respectively, wherein the specific values of the A2 and A3 are determined according to A1 and nb0, where nb0 is a positive integer less than or equal to the total number of columns of the base matrix. In one embodiment, in a specific embodiment, the A2 is equal to A1+function($\alpha \times$(nb0−2)/($\beta \times$3))+$\delta$, A3 is equal to A1+function($\alpha \times$(nb0−2)/($\beta \times$3))×2+$\delta$, where $\alpha$ is a real number greater than 0, $\beta$ is a real number greater than 0, $\delta$ is an integer greater than −10 and less than 10, function(•) means taking a closest upper integer, taking a closest lower integer, or taking an integer by rounding. In a specific embodiment, when the base graph matrix of the base matrix is BG1, then nb0=68; and when the base graph matrix of the base matrix is BG2, then nb0=52.

In one embodiment, in the redundancy version set, for the bit selections corresponding to the redundancy versions RV1 and RV2, the starting bit indices are A1×Z and A2×Z, respectively, wherein the specific values of the A1 and A2 are determined according to nb0, where nb0 is a positive integer less than or equal to the total number of columns of the base matrix. In one embodiment, in a specific embodiment, the A1 is equal to function($\alpha \times$(nb0−2)/($\beta \times$3))+$\delta$, the A2 is equal to function($\alpha \times$(nb0−2)/($\beta \times$3))×2+$\delta$. In a specific embodiment, when the base graph matrix of the base matrix is BG1, then nb0=68; and when the base graph matrix of the base matrix is BG2, then nb0=52.

In one embodiment, for the bit selection corresponding to the redundancy version RV3, the starting bit index is A3×Z, wherein A3 is equal to nb0−B, where nb0 is a positive integer less than or equal to the total number of columns in the base matrix, B is a positive integer less than nb0/4. In a specific embodiment, when the base graph matrix of the base matrix is BG1, then nb0=68; and when the base graph matrix of the base matrix is BG2, then nb0=52.

In one embodiment, in the redundancy version set, for the bit selections corresponding to the redundancy versions RV0, RV1, RV2 and RV3, the starting bit indices are A0×Z, A1×Z, A2×Z and A3×Z, respectively. There is a table, as shown below for defining the parameters A0, A1, A2, and A3, based on the set of RV0, RV1, RV2, and RV3, where the table corresponds to a circular cache of size (nb−2)×Z.

| RV0 | RV1 | RV2 | RV3 |
|-----|-----|-----|-----|
| A0  | A1  | A2  | A3  |

When the size of the circular cache is nb1×Z, in the redundancy version set, for the bit selections corresponding to the redundancy versions RV0, RV1, RV2 and RV3, the starting bit indices are function(nb1/(nb−2)×A0)×Z, function(nb1/(nb−2)×A1)×Z, function(nb1/(nb−2)×A2)×Z and function(nb1/(nb−2)×A3)×Z, respectively, where the nb is a positive integer equal to the total number of columns in the base matrix, and nb1 is a positive integer less than nb−2. In this manner, while the maximum cyclic cache size can be directly defined, the bit selection is performed in a scaling down manner to determine a starting bit index for each redundant version of the limited circular buffer. The operation is simple and convenient. In one example, the nb1 is smaller than nb−2, indicating that the cyclic cache is limited and cannot completely store the LDPC codeword sequence. This can be used in some low-power or low-complexity devices, and in some high-throughput devices as well.

In one embodiment, the redundancy version of the sequence to be transmitted for the first transmission is RV0 and the redundancy version of the first retransmission is determined according to the code rate R, which is a real number greater than 0 and less than 1. The first retransmission means that it is necessary to retransmit the data corresponding to the information packet bit sequence for the first time when the sequence to be transmitted is not correctly decoded at the first transmission. If the first retransmission data cannot be decoded correctly, it is necessary to perform a second retransmission. If there is still a decoding error, even a third retransmission is required. In one embodiment, the code rate R is a value obtained by dividing the length of the information packet bit sequence by the length of the bit sequence to be transmitted, or the code rate R is determined by a modulation coding scheme index.

In one embodiment, there are a plurality of preset code rate ranges each corresponding to a redundancy version value of a retransmission. One can determine a redundancy version value of a retransmission based on a predetermined code rate range in which the code rate R is located. There is no intersection between the plurality of preset code rate ranges. In one embodiment, there are two preset code rate ranges: a preset code rate range 1 including code rate greater than 0 and less than R0, and a preset code rate range 2 including code rate greater than or equal to R0 and less than 1. The preset code rate range 1 corresponds to the redundancy version value RV2 or RV3 of a retransmission, and the preset code rate range 2 corresponds to the redundancy version value RV1 of a retransmission. The R0 is a real number greater than 0 and less than 1. Alternatively, in a specific embodiment, when the base graph matrix of the base matrix is BG1, then R0 is a real number greater than or equal to ½ and less than or equal to ¾; and when the base graph matrix of the base matrix is BG2, then R0 is a real number greater than or equal to ⅓ and less than or equal to ½.

In one embodiment, there are three preset code rate ranges: a preset code rate range 1 including code rate greater than 0 and less than R0, a preset code rate range 2 including code rate greater than or equal to R0 and less than R1, and a preset code rate range 3 including code rate greater than or equal to R1 and less than 1. The preset code rate range 1 corresponds to the redundancy version value RV3 of a retransmission; the preset code rate range 2 corresponds to the redundancy version value RV2 of a retransmission; and the preset code rate range 3 corresponds to the redundancy version value RV1 of a retransmission. Each of the R0 and R1 is a real number greater than 0 and less than 1, and R0 is less than R1. Alternatively, in a specific embodiment, when the base graph matrix of the base matrix is BG1, then R0 is a real number less than or equal to ½ and greater than 0, R1 is a real number greater than ½ and less than 1; and when the base graph matrix of the base matrix is BG2, then R0 is a real number less than or equal to ⅓ and greater than 0, R1 is a real number greater than ⅓ and less than 1.

In one embodiment, the R0 is determined on the basis of kb1 and A3, and the R1 is determined based on kb1 and A2, wherein the kb1 is a positive integer less than or equal to the number of system columns of the base matrix. Alternatively, in a specific embodiment, the R0 is equal to kb1/A3×α, the R1 is equal to kb1/A2×β, and each of α and β is a real number greater than zero.

In one embodiment, the redundancy version of the bit sequence to be transmitted in the first transmission is RV0 and the redundancy version value of the first retransmission is determined based on the length and the lifting size of bit sequence to be transmitted in the first transmission.

In one embodiment, there are a plurality of preset integer ranges, each of the preset integer ranges corresponding to a redundancy version value of a retransmission. One can determine a redundancy version value of a retransmission based on a predetermined code rate range in which the code rate function(N/Z) is located, where N is the length of the bit sequence to be transmitted, Z is the lifting size, and there is no intersection between the plurality of preset integer ranges. In one embodiment, there are three preset integer ranges: a preset integer range 1 including integers greater than 0 and less than C0; a preset integer range 2 including integers greater than or equal to C0 and less than C1; and a preset integer range 3 including integers greater than or equal to C1 and less than C. The preset integer range 1 corresponds to the redundancy version value RV1 of a retransmission; the preset integer range 2 corresponds to the redundancy version value RV2 of a retransmission; and the preset integer range 3 corresponds to the redundancy version value RV3 of a retransmission. The C0, C1, and C are positive integers, and C0 is less than C1, both C0 and C1 are less than C. In one embodiment, the C is equal to nb2−2, wherein the nb2 is a positive integer less than or equal to the total number of columns of the base matrix. Alternatively, in a specific embodiment, when the base graph matrix of the base matrix is BG1, then C0 is an integer greater than 27 or less than 37, C1 is an integer greater than 44 or less than 53, and C is equal to 66; and when the base graph matrix of the base matrix is BG2, then C0 is an integer greater than 19 or less than 29, C1 is an integer greater than 30 or less than 42, and C is equal to 50. Further, in a specific embodiment, when the base graph matrix of the base matrix is BG1, then C0 is equal to 32, C1 is equal to 48, C is equal to 66; and when the base graph matrix of the base matrix is BG2, then C0 is equal to 24, C1 is equal to 36, C is equal to 50.

In one embodiment, the rate matched bit sequence is interleaved according to a predetermined index number sequence to obtain a bit sequence to be transmitted corresponding to the redundancy version index.

Figure 6:
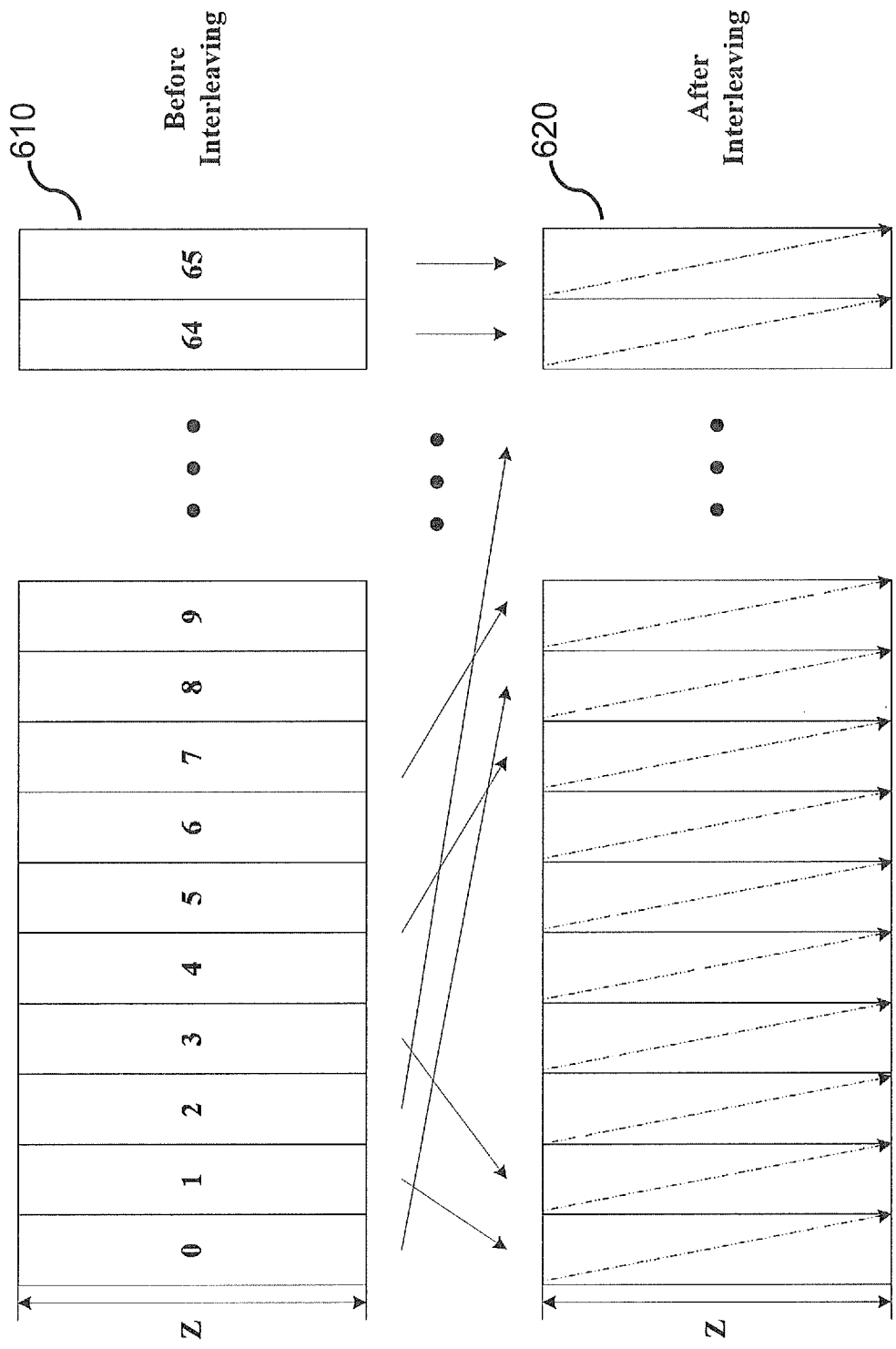
FIG. 6 illustrates an exemplary interleaving scheme performed on LDPC coded bits, in accordance with some embodiments of the present disclosure.

Bit-level interleaving can be used by LDPC code to improve high code rate performance and/or to counter burst error. An exemplary interleaving for BG1 is shown in FIG. 6, where one LDPC codeword 610 is organized into 66 units, and each unit contains Z bits. Then an interleaving among these units is performed before writing the interleaved codeword 620 into a circular buffer.

In one embodiment, with respect to the bit interleaving of the rate matched bit sequence: the bit sequence before interleaving is: $x_0, x_1, x_2, \ldots, x_{N-1}$, the bit sequence after interleaving is: $y_0, y_1, y_2, \ldots, y_{N-1}$, wherein the interleaving method is: $y_k = x_{\pi(k)}$, wherein the $\pi(0), \pi(1), \pi(2), \ldots, \pi(N-1)$ is the predetermined index number sequence.

In one embodiment, the predetermined index number sequence is obtained according to a block interleaver, wherein the number of rows of the block interleaver is $R_{subblock}$. One can determine the number of columns of the block interleaver is $C_{subblock}$, based on the length N of the rate matched bit sequence and the $R_{subblock}$. The $C_{subblock}$ is the smallest integer that satisfies $N \leq (R_{subblock} \times C_{subblock})$. The block interleaver is in a "row-in column-out" manner. When $N \leq (R_{subblock} \times C_{subblock})$ it is necessary to fill $(R_{subblock} \times C_{subblock}) - N$ bits in the last row. In the block interleaving, the column permutation is also performed and then the interleaved bit sequence is read out in the order of the columns. The predetermined index number sequence may be obtained according to the block interleaving method, and the interleaved bit sequence is obtained according to the formula $y_k = x_{\pi(k)}$.

In one embodiment, the number of rows $R_{subblock}$ of the block interleaver is a positive integer multiple of the modulation order, wherein the modulation order is an integer greater than zero. The modulation order refers to the number of bits carried by the constellation modulation symbol. For example, the constellation symbol modulation includes: BPSK, QPSK, 16 QAM, 64 QAM and 256 QAM, and their corresponding modulation orders (the number of bits carried by each constellation symbol) are: 1, 2, 4, 6 and 8, respectively.

In one embodiment, the block interleaver also performs column permutations according to a sequence of the predetermined column index numbers, the length of the predetermined column index sequence being less than or equal to the number of columns of the block interleaver.

In a QAM modulation, a constellation symbol consists of an in-phase signal and a quadrature signal. According to the orthogonality of the two signals, a constellation symbol can carry two parallel data (I and Q). For example, 4 QAM carries 2 bits, 16 QAM carries 4 bits, 64 QAM carries 6 bits, and 256 QAM carries 8 bits, and so on.

Figure 8:
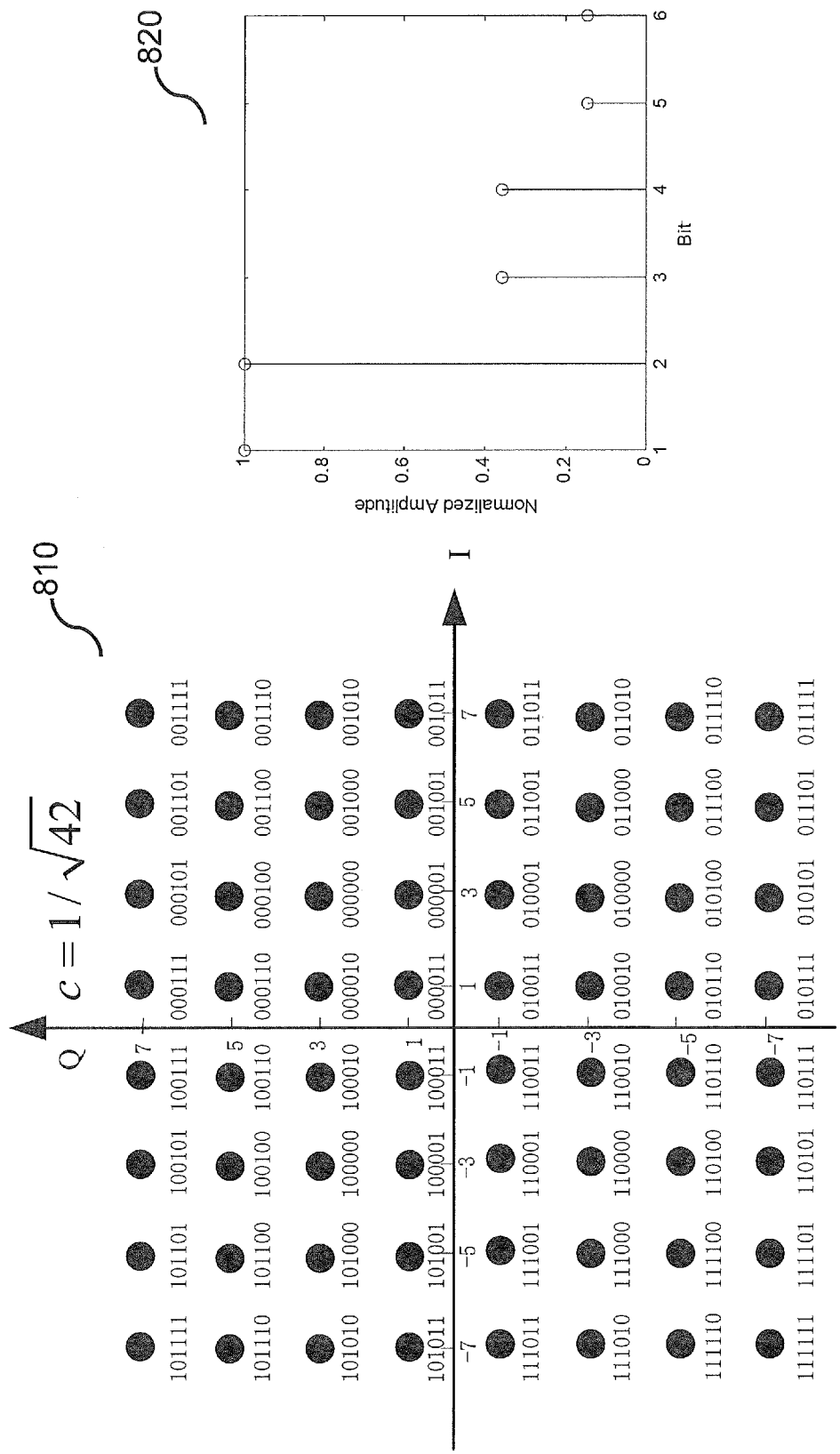
FIG. 8 illustrates a constellation of 64 QAM and its corresponding demodulated LLRs, in accordance with some embodiments of the present disclosure.

Constellation diagrams 710, 810 of high order modulation (i.e. modulation order≥16) of 16 QAM and 64 QAM are shown in FIG. 7 and FIG. 8, respectively. In FIG. 7, the normalized amplitude of demodulated LLRs 720 with 4 bits for 16 QAM are also depicted. The LLRs for 16 QAM can be divided into two groups: first 2 LLRs with larger amplitude and the remaining 2 LLRs with smaller amplitude. Similarly, three different amplitude groups can be observed in demodulated LLRs 820 of 64 QAM as shown in FIG. 8. The value of LLRs amplitude indicates a confidence degree or reliability. The larger LLRs amplitude is, the more reliable the LLR is. Therefore, the amplitude of demodulated LLRs for high order modulation has inherent variation even in AWGN channel. This unequal bit reliability of high order modulation may impair the performance for LDPC code.

Figure 9:
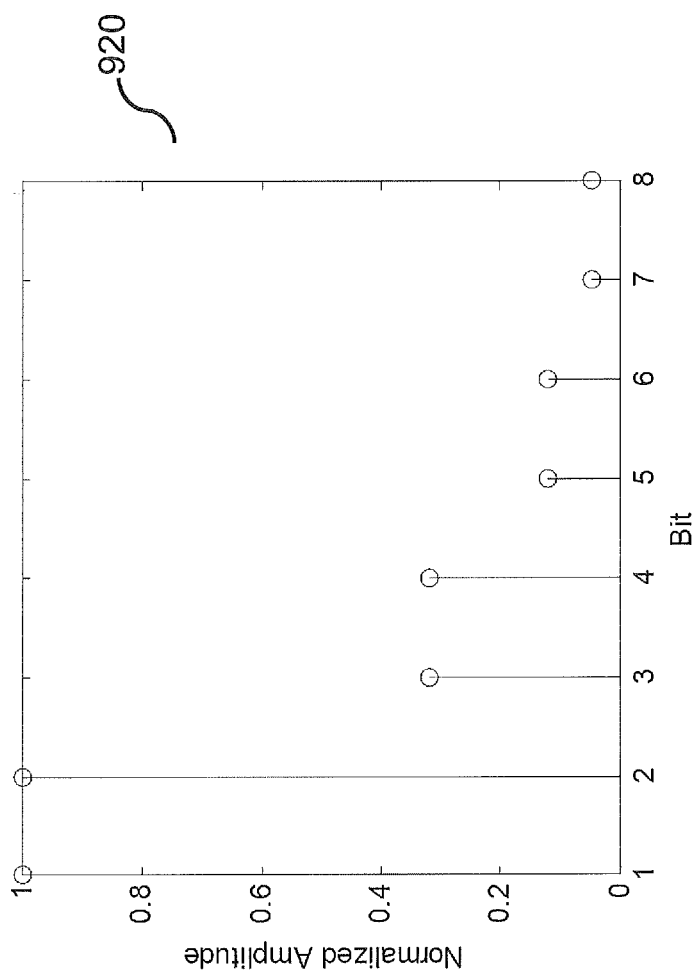
FIG. 9 illustrates demodulated LLRs corresponding to a constellation of 256 QAM, in accordance with some embodiments of the present disclosure.

Due to unequal amplitude of demodulated LLRs for 16 QAM/64 QAM/256 QAM, it is desirable to consider a bit interleaving scheme for high order modulation to enhance the performance for LDPC code. An exemplary interleaving scheme for 256 QAM is disclosed herein. As shown in FIG. 9, the 8 mapped bits 920 of 256 QAM can be divided into 4 groups: group-1 including the $1^{st}$ and the $2^{nd}$ bit, group-2 including the $3^{rd}$ and the $4^{th}$ bit, group-3 including the $5^{th}$ and the $6^{th}$ bit, and group-4 including the $7^{th}$ and the $8^{th}$ bit. The demodulated LLR for group-1 has largest amplitude with highest reliability, while group-2 has the second highest reliability, group-3 has the third reliability, and group-4 has the least reliability.

Figure 10:
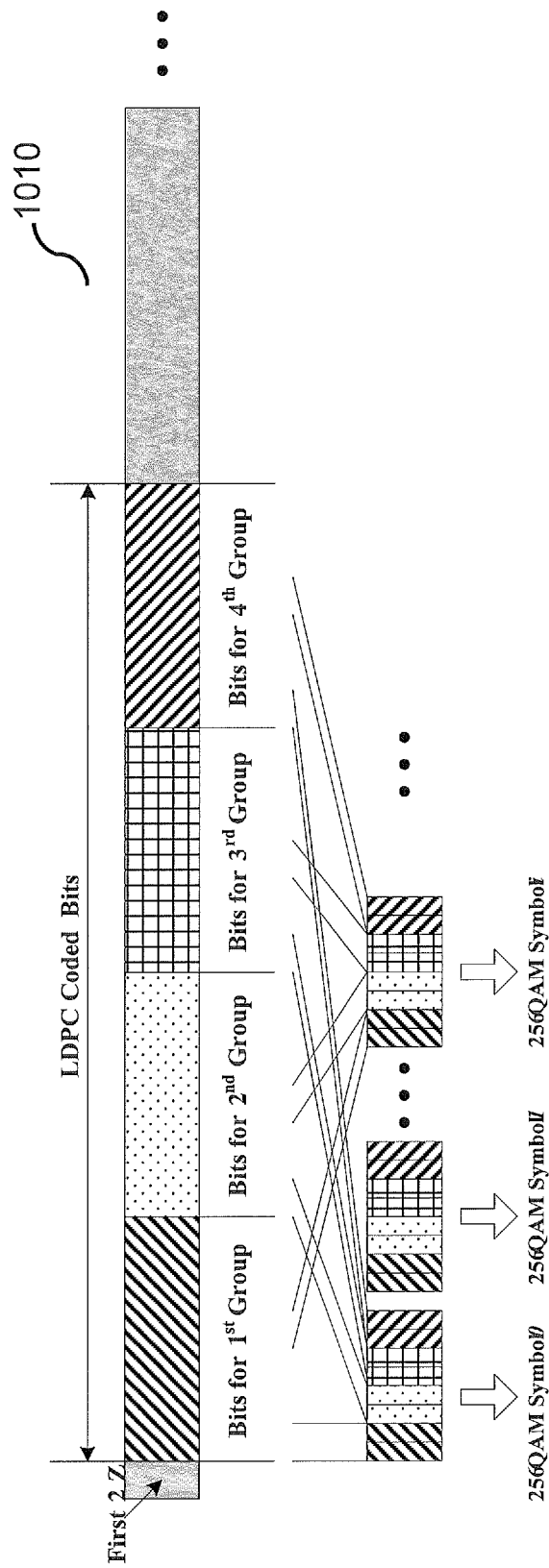
FIG. 10 illustrates another exemplary interleaving scheme performed on LDPC coded bits, in accordance with some embodiments of the present disclosure.

As shown in FIG. 10, the LDPC coded bits 1010 are divided into 4 groups. The bits in $1^{st}$ group are mapped in group-1 for all 256 QAM constellation symbols. Similarly, bits in $2^{nd}$ group are mapped in group-2, bits in $3^{rd}$ group are mapped in group-3, and bits in $4^{th}$ group are mapped in group-4. This is one exemplary bit-level interleaving method to improve the performance of high order modulation.

Figure 11:
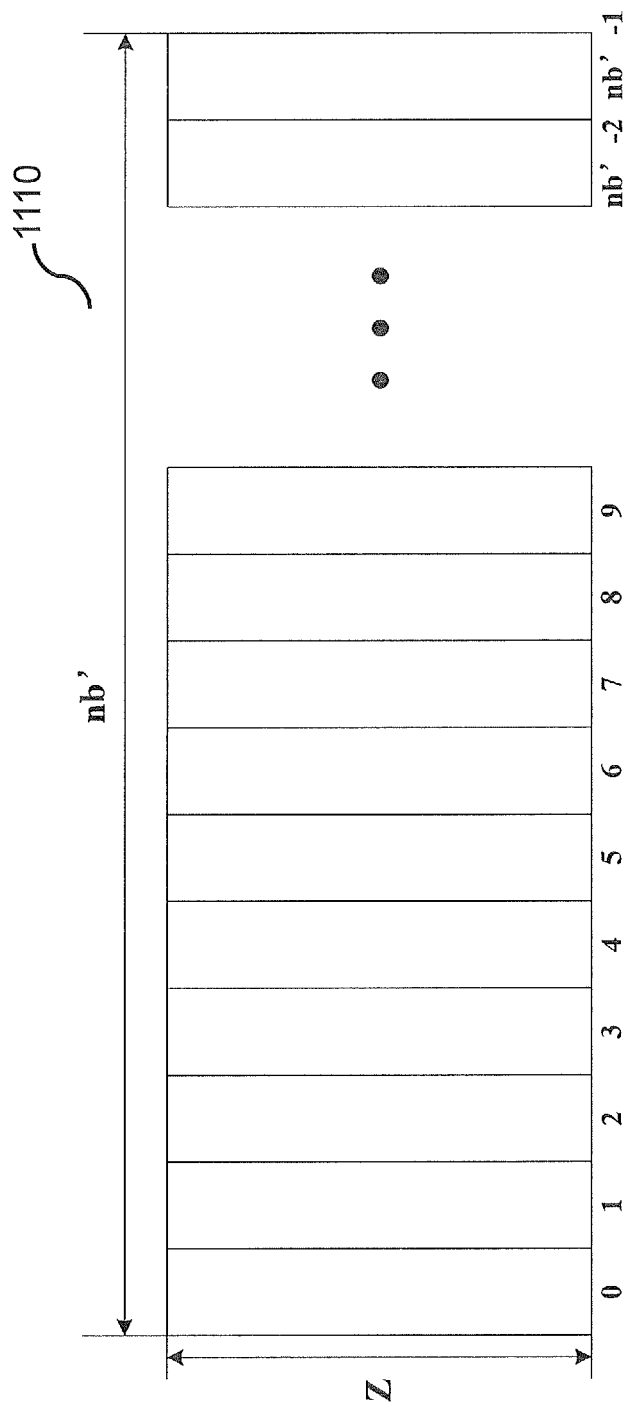
FIG. 11 illustrates an exemplary limited buffer rate matching scheme for LDPC code, in accordance with some embodiments of the present disclosure.

Limited buffer rate matching (LBRM) may be supported for NR-LDPC. For an LDPC decoder, the lower the code rate is, the more latency the decoding has. Therefore, it is desirable to support LBRM for LDPC coding for different UE category. It is suitable to set the size of LBRM to be an integral multiple of Z, as nb'×Z 1110, as shown in FIG. 11. For a very low latency UE or a very low complexity UE, the size of the circular buffer can be set small. The smallest value of nb' is kb+4, wherein kb=22 for BG1 and kb=10 for BG2. For a high reliability UE, the size of circular buffer can be equal to nb, wherein nb=66 for BG1 and nb=50 for BG2.

Two definitions of [RV0, RV1, RV2, RV3] are disclosed in the following two embodiments respectively.

Figure 12:
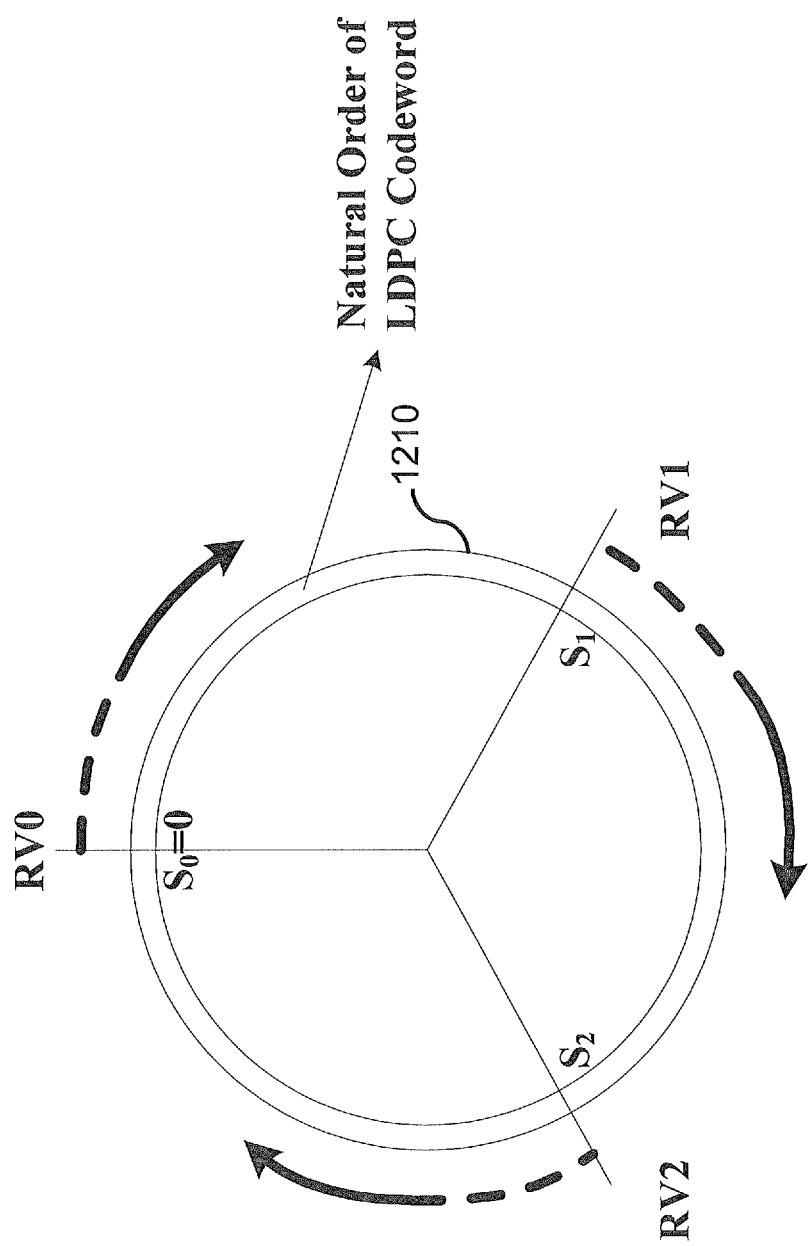
FIG. 12 illustrates exemplary starting bit locations for redundancy versions RV0, RV1, RV2, in accordance with some embodiments of the present disclosure.
Figure 13:
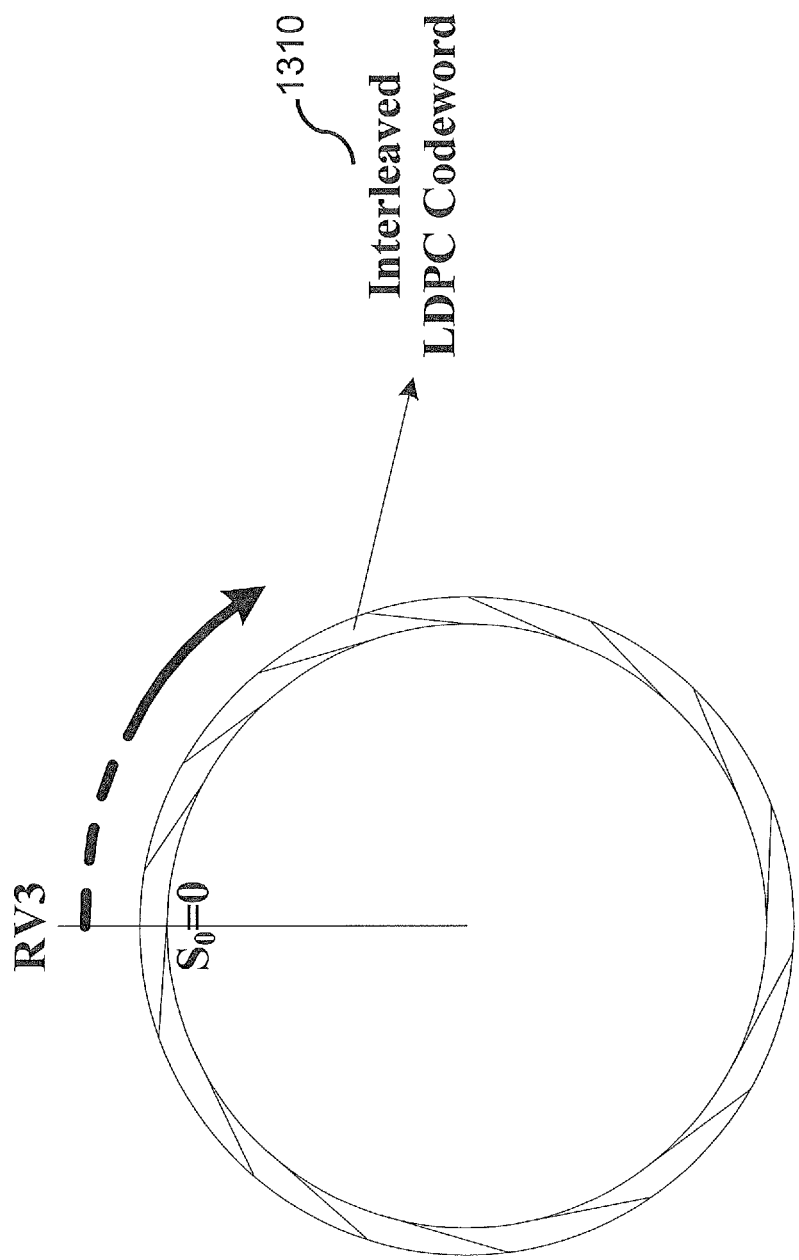
FIG. 13 illustrates an exemplary starting bit location for redundancy version RV3, in accordance with some embodiments of the present disclosure.

In a first embodiment, the starting bit locations for [RV0, RV1, RV2] are defined as shown in FIG. 12. An LDPC codeword 1210 has a natural order in the circular buffer. The LDPC codeword in the circular buffer includes Ncb bits (0 to Ncb−1) that are selected from bits 2*Z to 2*Z+Ncb−1 in the mother LDPC codeword. The starting bit location of RV0 is defined as Si=0; the starting bit location of RV1 is defined as (function(Ncb/(3×Z)))×Z; and the starting bit location of RV2 is defined as (function(Ncb/(3×Z)))×2×Z. A simple representation for definitions of RV0, RV1 and RV2 has the following expression: $S_i$=(function(Ncb/(3×Z)))× $RV_1$×Z wherein, RV0=0, RV1=1 and RV2=2. For the redundancy version RV3 in this embodiment, the retransmission data is selected from an interleaved LDPC codeword 1310, as shown in FIG. 13. The interleaved LDPC codeword 1310 in the circular buffer includes Ncb bits (0 to Ncb−1) that are selected from bits 2*Z to 2*Z+Ncb−1 in the interleaved mother LDPC codeword. A block interleaving scheme with Z columns can be used to generate the interleaved mother LDPC codeword to make data corresponding to RV3 self-decodable.

Figure 14:
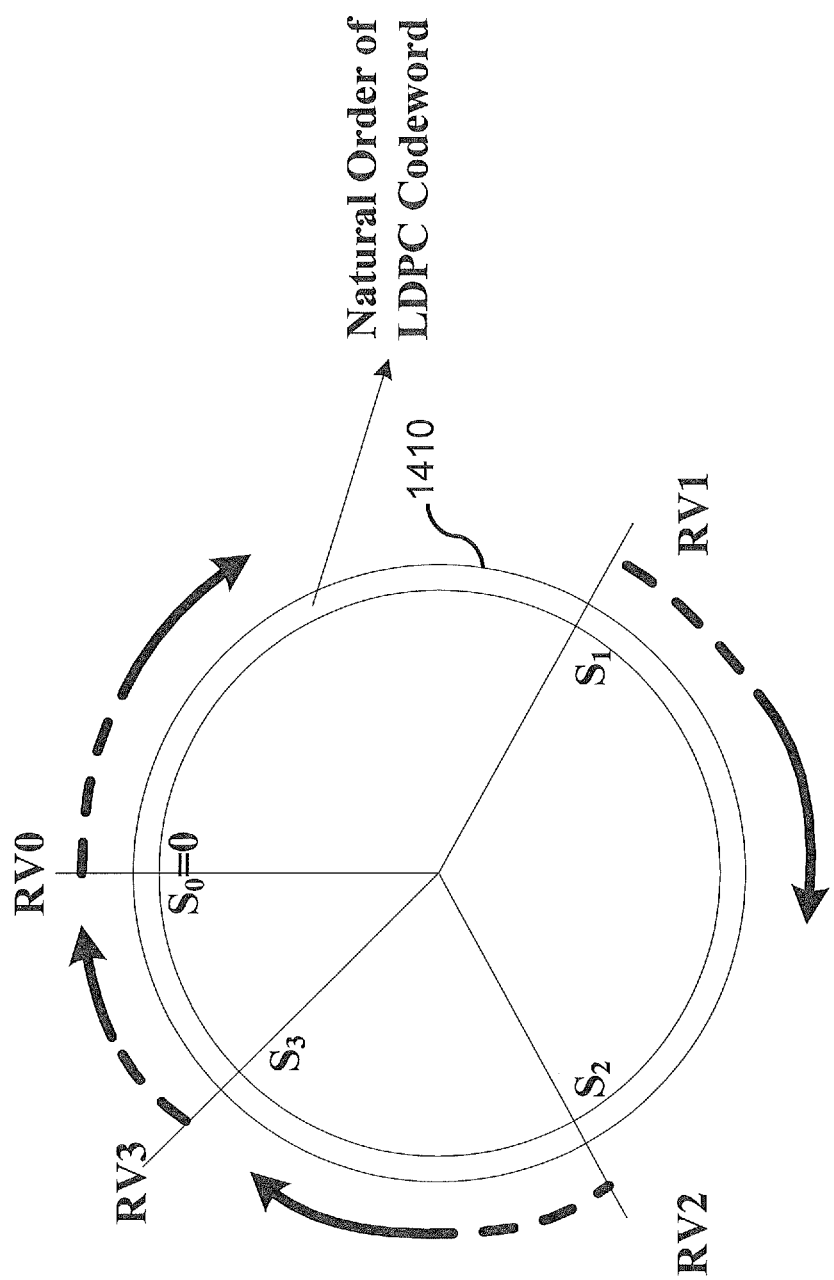
FIG. 14 illustrates exemplary starting bit locations for redundancy versions RV0, RV1, RV2, RV3, in accordance with some embodiments of the present disclosure.

In a second embodiment, as shown in FIG. 14, the starting bit location design for [RV0, RV1, RV2] is the same as that in the first embodiment; and the starting bit location for the RV3 is set near the end of the LDPC codeword 1410. In the circular buffer, the LDPC codeword 1410 has a natural order. In one example, the starting bit location of RV3 is defined as: RV3=56 for BG1 and RV3=43 for BG2.

While various embodiments of the present disclosure have been described above, it should be understood that they have been presented by way of example only, and not by way of limitation. Likewise, the various diagrams may depict an example architectural or configuration, which are provided to enable persons of ordinary skill in the art to understand exemplary features and functions of the present disclosure. Such persons would understand, however, that the present disclosure is not restricted to the illustrated example architectures or configurations, but can be implemented using a variety of alternative architectures and configurations. Additionally, as would be understood by persons of ordinary skill in the art, one or more features of one embodiment can be combined with one or more features of another embodiment described herein. Thus, the breadth and scope of the present disclosure should not be limited by any of the above-described exemplary embodiments.

It is also understood that any reference to an element herein using a designation such as "first," "second," and so forth does not generally limit the quantity or order of those elements. Rather, these designations can be used herein as a convenient means of distinguishing between two or more elements or instances of an element. Thus, a reference to first and second elements does not mean that only two elements can be employed, or that the first element must precede the second element in some manner.

Additionally, a person having ordinary skill in the art would understand that information and signals can be represented using any of a variety of different technologies and techniques. For example, data, instructions, commands, information, signals, bits and symbols, for example, which may be referenced in the above description can be represented by voltages, currents, electromagnetic waves, magnetic fields or particles, optical fields or particles, or any combination thereof.

A person of ordinary skill in the art would further appreciate that any of the various illustrative logical blocks, modules, processors, means, circuits, methods and functions described in connection with the aspects disclosed herein can be implemented by electronic hardware (e.g., a digital implementation, an analog implementation, or a combination of the two), firmware, various forms of program or design code incorporating instructions (which can be referred to herein, for convenience, as "software" or a "software module), or any combination of these techniques.

To clearly illustrate this interchangeability of hardware, firmware and software, various illustrative components, blocks, modules, circuits, and steps have been described above generally in terms of their functionality. Whether such functionality is implemented as hardware, firmware or software, or a combination of these techniques, depends upon the particular application and design constraints imposed on the overall system. Skilled artisans can implement the described functionality in various ways for each particular application, but such implementation decisions do not cause a departure from the scope of the present disclosure. In accordance with various embodiments, a processor, device, component, circuit, structure, machine, module, etc. can be configured to perform one or more of the functions described herein. The term "configured to" or "configured for" as used herein with respect to a specified operation or function refers to a processor, device, component, circuit, structure, machine, module, etc. that is physically constructed, programmed and/or arranged to perform the specified operation or function.

Furthermore, a person of ordinary skill in the art would understand that various illustrative logical blocks, modules, devices, components and circuits described herein can be implemented within or performed by an integrated circuit (IC) that can include a general purpose processor, a digital signal processor (DSP), an application specific integrated circuit (ASIC), a field programmable gate array (FPGA) or other programmable logic device, or any combination thereof. The logical blocks, modules, and circuits can further include antennas and/or transceivers to communicate with various components within the network or within the device. A general purpose processor can be a microprocessor, but in the alternative, the processor can be any conventional processor, controller, or state machine. A processor can also be implemented as a combination of computing devices, e.g., a combination of a DSP and a microprocessor, a plurality of microprocessors, one or more microprocessors in conjunction with a DSP core, or any other suitable configuration to perform the functions described herein.

If implemented in software, the functions can be stored as one or more instructions or code on a computer-readable medium. Thus, the steps of a method or algorithm disclosed herein can be implemented as software stored on a computer-readable medium. Computer-readable media includes both computer storage media and communication media including any medium that can be enabled to transfer a computer program or code from one place to another. A storage media can be any available media that can be accessed by a computer. By way of example, and not limitation, such computer-readable media can include RAM, ROM, EEPROM, CD-ROM or other optical disk storage, magnetic disk storage or other magnetic storage devices, or any other medium that can be used to store desired program code in the form of instructions or data structures and that can be accessed by a computer.

In this document, the term "module" as used herein, refers to software, firmware, hardware, and any combination of these elements for performing the associated functions described herein. Additionally, for purpose of discussion, the various modules are described as discrete modules; however, as would be apparent to one of ordinary skill in the art, two or more modules may be combined to form a single module that performs the associated functions according embodiments of the present disclosure.

Additionally, memory or other storage, as well as communication components, may be employed in embodiments of the present disclosure. It will be appreciated that, for clarity purposes, the above description has described embodiments of the present disclosure with reference to different functional units and processors. However, it will be apparent that any suitable distribution of functionality between different functional units, processing logic elements or domains may be used without detracting from the present disclosure. For example, functionality illustrated to be performed by separate processing logic elements, or controllers, may be performed by the same processing logic element, or controller. Hence, references to specific functional units are only references to a suitable means for providing the described functionality, rather than indicative of a strict logical or physical structure or organization.

Various modifications to the implementations described in this disclosure will be readily apparent to those skilled in the art, and the general principles defined herein can be applied to other implementations without departing from the scope of this disclosure. Thus, the disclosure is not intended to be limited to the implementations shown herein, but is to be accorded the widest scope consistent with the novel features and principles disclosed herein, as recited in the claims below.

What is claimed is:

1. A method performed by a first node, the method comprising:
   encoding an information bit sequence based on a base matrix and a lifting size Z to obtain an encoded bit sequence;
   generating a master bit sequence based on the encoded bit sequence, wherein the master bit sequence includes Ncb bits, bit 0 to Ncb−1, that are selected from bits 2\*Z to 2\*Z+Ncb−1 in the encoded bit sequence;
   selecting a subset of the master bit sequence according to a rate matching rule to obtain a rate matched bit sequence;
   interleaving the rate matched bit sequence to obtain a to-be-transmitted bit sequence; and
   transmitting the to-be-transmitted bit sequence to a second node,
   wherein the subset of the master bit sequence is selected based on one of at least four redundancy versions: RV0, RV1, RV2, and RV3,
   wherein when the subset of the master bit sequence is selected based on the redundancy version RV1, the rate matched bit sequence is obtained by selecting a sub-sequence starting from bit 13×Z in the master bit sequence.

2. The method of claim 1, wherein the rate matched bit sequence corresponds to the redundancy version RV0 and is obtained by selecting a sub-sequence starting from bit 0 in the master bit sequence.

3. The method of claim 1, wherein the rate matched bit sequence corresponds to at least one of the redundancy versions in the set of redundancy versions and is obtained by: selecting a sub-sequence starting from bit (function($\alpha \times$ Ncb/($\beta \times 3 \times Z$))+$\delta$)×Z in the master bit sequence, wherein $\alpha$ is a positive real number, $\beta$ is a positive real number, $\delta$ is an integer greater than −10 and less than 10, and function(•) means taking a closest upper integer, taking a closest lower integer, or taking an integer by rounding.

4. The method of claim 1, wherein the rate matched bit sequence corresponds to at least one of the redundancy versions in the set of redundancy versions and is obtained by: selecting a sub-sequence starting from bit (function($\alpha \times$ Ncb/($\beta \times 3 \times Z$))×2+$\delta$)×Z in the master bit sequence, wherein $\alpha$ is a positive real number, $\beta$ is a positive real number, $\delta$ is an integer greater than −10 and less than 10, and function(•) means taking a closest upper integer, taking a closest lower integer, or taking an integer by rounding.

5. The method of claim 1, wherein the rate matched bit sequence corresponds to the redundancy version RV3 and is obtained by: selecting a sub-sequence starting from bit Ncb−x0 in the master bit sequence, wherein x0 is a positive integer less than Ncb/4.

6. The method of claim 1, wherein the rate matched bit sequence corresponds to at least one of the redundancy versions in the set of redundancy versions and is obtained by: selecting a sub-sequence starting from bit x1 in the master bit sequence, wherein x1 is determined based on R max, and R max is a real number greater than 0.8 and less than 1.

7. The method of claim 1, wherein the rate matched bit sequence corresponds to at least one of the redundancy versions in the set of redundancy versions and is obtained by: interleaving the master bit sequence to generate an interleaved master bit sequence and selecting a sub-sequence starting from bit x2 in the interleaved master bit sequence, wherein x2 is a non-negative integer less than Ncb.

8. The method of claim 1, wherein the rate matched bit sequence corresponds to the redundancy versions RV1 or RV2 and is obtained by: selecting a sub-sequence starting from bit A3×Z in the master bit sequence, wherein A3 is an integer and satisfies Ncb/(4×Z)≤A3≤Ncb/(2×Z).

9. A method performed by a first node, the method comprising:
   encoding an information bit sequence based on a base matrix and a lifting size Z to obtain an encoded bit sequence;
   generating a master bit sequence based on the encoded bit sequence, wherein the master bit sequence includes Ncb bits, bit 0 to Ncb−1, that are selected from bits 2\*Z to 2\*Z+Ncb−1 in the encoded bit sequence;
   selecting a subset of the master bit sequence according to a rate matching rule to obtain a rate matched bit sequence;
   interleaving the rate matched bit sequence to obtain a to-be-transmitted bit sequence; and
   transmitting the to-be-transmitted bit sequence to a second node, wherein:
   the rate matched bit sequence corresponds to a redundancy version RV3 and is obtained by selecting a sub-sequence starting from bit A×Z in the master bit sequence, and
   A is equal to 56 for a base graph 1 and is equal to 43 for a base graph 2.

10. The method of claim 9, wherein:
   for the base graph 1, the base matrix includes 46 rows and 68 columns; and
   for the base graph 2, the base matrix includes 42 rows and 52 columns.

11. A first communication node comprising a processor, wherein the processor is configured to:
   encode an information bit sequence based on a base matrix and a lifting size Z to obtain an encoded bit sequence;
   generate a master bit sequence based on the encoded bit sequence, wherein the master bit sequence includes Ncb bits, bit 0 to Ncb−1, that are selected from bits 2\*Z to 2\*Z+Ncb−1 in the encoded bit sequence;
   select a subset of the master bit sequence according to a rate matching rule to obtain a rate matched bit sequence;
   interleave the rate matched bit sequence to obtain a to-be-transmitted bit sequence; and
   transmit the to-be-transmitted bit sequence to a second communication node,
   wherein the subset of the master bit sequence is selected based on one of at least four redundancy versions: RV0, RV1, RV2, and RV3,
   wherein when the subset of the master bit sequence is selected based on the redundancy version RV1, the rate matched bit sequence is obtained by selecting a sub-sequence starting from bit 13×Z in the master bit sequence.

12. The first communication node of claim 11, wherein the rate matched bit sequence corresponds to the redundancy version RV0 and is obtained by selecting a sub-sequence starting from bit 0 in the master bit sequence.

13. The first communication node of claim 11, wherein the rate matched bit sequence corresponds to at least one of the redundancy versions in the set of redundancy versions and is obtained by: selecting a sub-sequence starting from bit (function($\alpha \times$Ncb/($\beta \times 3 \times Z$))+$\delta$)×Z in the master bit sequence, wherein $\alpha$ is a positive real number, $\beta$ is a positive real number, $\delta$ is an integer greater than −10 and less than 10, and function(•) means taking a closest upper integer, taking a closest lower integer, or taking an integer by rounding.

14. The first communication node of claim 11, wherein the rate matched bit sequence corresponds to at least one of the redundancy versions in the set of redundancy versions and is obtained by: selecting a sub-sequence starting from bit $(\text{function}(\alpha \times \text{Ncb}/(\beta \times 3 \times Z)) \times 2 + \delta) \times Z$ in the master bit sequence.

15. The first communication node of claim 11, wherein the rate matched bit sequence corresponds to the redundancy version RV3 and is obtained by: selecting a sub-sequence starting from bit Ncb−x0 in the master bit sequence, wherein x0 is a positive integer less than Ncb/4.

16. The first communication node of claim 11, wherein the rate matched bit sequence corresponds to at least one of the redundancy versions in the set of redundancy versions and is obtained by: selecting a sub-sequence starting from bit x1 in the master bit sequence, wherein x1 is determined based on R max, and R max is a real number greater than 0.8 and less than 1.

17. The first communication node of claim 11, wherein the rate matched bit sequence corresponds to at least one of the redundancy versions in the set of redundancy versions and is obtained by: interleaving the master bit sequence to generate an interleaved master bit sequence and selecting a sub-sequence starting from bit x2 in the interleaved master bit sequence, wherein x2 is a non-negative integer less than Ncb.

18. The first communication node of claim 11, wherein the rate matched bit sequence corresponds to the redundancy versions RV1 or RV2 and is obtained by: selecting a sub-sequence starting from bit A3×Z in the master bit sequence, wherein A3 is an integer and satisfies Ncb/(4×Z)≤A3≤Ncb/(2×Z).

19. A first communication node comprising a processor and a memory, wherein the memory stores instructions that, when executed, causes the processor to:
 encode an information bit sequence based on a base matrix and a lifting size Z to obtain an encoded bit sequence;
 generate a master bit sequence based on the encoded bit sequence, wherein the master bit sequence includes Ncb bits, bit 0 to Ncb−1, that are selected from bits 2\*Z to 2\*Z+Ncb−1 in the encoded bit sequence;
 select a subset of the master bit sequence according to a rate matching rule to obtain a rate matched bit sequence;
 interleave the rate matched bit sequence to obtain a to-be-transmitted bit sequence; and
 transmit the to-be-transmitted bit sequence to a second communication node, wherein:
 the rate matched bit sequence corresponds to the redundancy version RV3 and is obtained by selecting a sub-sequence starting from bit A×Z in the master bit sequence, and
 A is equal to 56 for a base graph 1 and is equal to 43 for a base graph 2.

20. The first communication node of claim 19, wherein:
 for the base graph 1, the base matrix includes 46 rows and 68 columns; and
 for the base graph 2, the base matrix includes 42 rows and 52 columns.

\* \* \* \* \*